(12) United States Patent
Titus

(10) Patent No.: US 9,735,769 B1
(45) Date of Patent: Aug. 15, 2017

(54) CONTROLLING CURRENT OR MITIGATING ELECTROMAGNETIC OR RADIATION INTERFERENCE EFFECTS USING MULTIPLE AND DIFFERENT SEMI-CONDUCTIVE CHANNEL REGIONS GENERATING STRUCTURES

(71) Applicant: The United States of America as represented by the Secretary of the Navy, Washington, DC (US)

(72) Inventor: Jeffrey L. Titus, Bloomington, IN (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 96 days.

(21) Appl. No.: 14/873,680

(22) Filed: Oct. 2, 2015

(51) Int. Cl.
*H01L 27/085* (2006.01)
*H03K 17/16* (2006.01)
*H01L 29/49* (2006.01)
*H01L 29/78* (2006.01)

(52) U.S. Cl.
CPC ......... *H03K 17/162* (2013.01); *H01L 27/085* (2013.01); *H01L 29/495* (2013.01); *H01L 29/7802* (2013.01); *H01L 29/7832* (2013.01)

(58) Field of Classification Search
CPC .... H01L 27/085; H01L 27/095; H01L 29/495
See application file for complete search history.

(56) References Cited

U.S. PATENT DOCUMENTS

| | | | | |
|---|---|---|---|---|
| 7,518,189 B1* | 4/2009 | Hackler, Sr. | ........ | H01L 21/2256 257/134 |
| 2015/0014786 A1* | 1/2015 | Jin | ...................... | H01L 21/8238 257/392 |
| 2015/0028351 A1* | 1/2015 | Van Brunt | .......... | H01L 29/1608 257/77 |

\* cited by examiner

*Primary Examiner* — Jeffrey Zweizig
(74) *Attorney, Agent, or Firm* — Christopher A. Monsey

(57) ABSTRACT

Systems and methods for controlling current or mitigating electromagnetic or radiation interference effects using multiple different semi-conductive channel regions generating structures formed by multiple different semi-conductive electrical current or voltage control structures. One embodiment includes providing a first and second metal oxide semiconductor field effect transistor (MOSFET) sections formed on opposite sides of a metal-semiconductor field effect transistor (MESFET) such that operation of the MESFET modulates or controls current otherwise controlled by an electrical path of the MOSFET sections. A control system for determining when an embodiment of the invention is to be operated is also provided to include automated systems including sensors as well as manually operated systems. Automated systems can include radiation sensors as well as other control systems such as high voltage radio frequency transmitter or receiver systems. Methods of operation for a variety of modes are also provided.

64 Claims, 33 Drawing Sheets

Cross Sectional View of N-Channel MESFET (PRIOR ART)

Cross Sectional View of P-Channel MESFET (PRIOR ART)

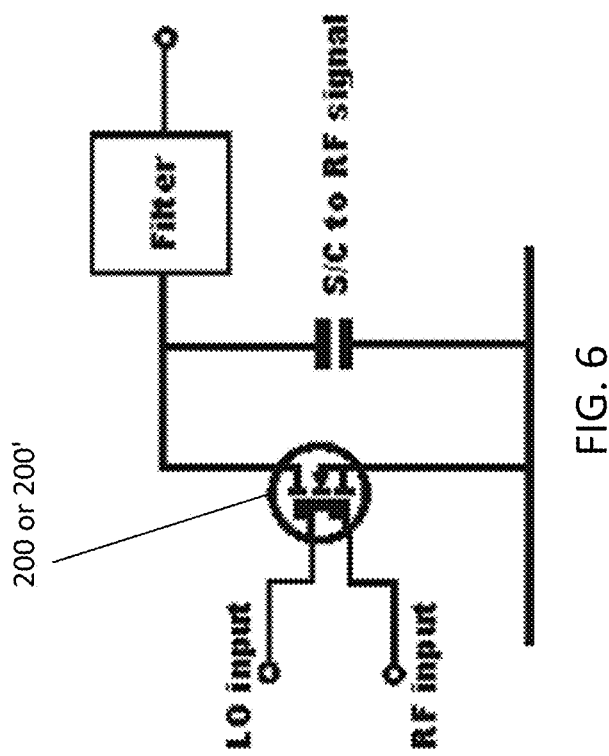

(MOS Cut-Off)

(AC Mode)

CONTROLLING CURRENT OR MITIGATING ELECTROMAGNETIC OR RADIATION INTERFERENCE EFFECTS USING MULTIPLE AND DIFFERENT SEMI-CONDUCTIVE CHANNEL REGIONS GENERATING STRUCTURES

STATEMENT REGARDING FEDERALLY SPONSORED RESEARCH OR DEVELOPMENT

The invention described herein was made in the performance of official duties by employees of the Department of the Navy and may be manufactured, used and licensed by or for the United States Government for any governmental purpose without payment of any royalties thereon. This invention (Navy Case 200,287) is assigned to the United States Government and is available for licensing for commercial purposes. Licensing and technical inquiries may be directed to the Technology Transfer Office, Naval Surface Warfare Center Crane, email: Cran_CTO@navy.mil.

BACKGROUND AND SUMMARY OF THE INVENTION

Vertical Double-Diffused Metal Oxide Field Effect Transistors (VDMOSFETs) are used because of their high-current, high-voltage capabilities. FIGS. 1a and 1b respectively represent simplified cross-sectional views of a basic design/layout of N-channel and P-Channel VDMOSFETs 1, 3, respectively (a structure is cut parallel to sources along a metal oxide semiconductor (MOS) gate—cut lines are shown as AB in FIGS. 2a and 2b). A VDMOSFET 1 as shown is made of a doped substrate (e.g., N-channel devices use N+ substrates 104; whereas, FIG. 1b shows a P-channel device using P+ substrates 113). A conductive layer contacting bottom of a substrate 104 (for N-channel) or substrate 113 (for P-channel) forms a drain contact 102. At top of substrate 104 or 113 is a lighter-doped epitaxial layer (N-channel devices use N-type silicon 103; referring to FIG. 1b, P-channel devices use P-type silicon 112). In an alternative embodiment (not shown), a second epitaxial layer (referred to as a buffer layer in this example) can be added between layers 103 and 104 (for N-channel) to enhance single-event burnout (SEB) performance. At a surface of the exemplary epitaxial layer 103, a region of opposite doping 105, 105' is implanted/diffused to form a doped region (hereinafter referred to as body) (e.g., N-channel devices use P-type doping (P-body) 105, 105' and P-channel devices use N-type doping (N-body) 114, 114'). To ensure good contact between source contact and body, e.g., 101 and 105, a higher doped region, e.g., 106, can be implanted/diffused into the exemplary body (e.g., N-channel device use a higher doped P region 106, 106' and P-channel devices use a higher doped N region 115, 115'). Once doped regions, e.g., various bodies (e.g., P-body 105, 105' or N-body 115, 115') are manufactured, an opposite doping of exemplary body region (e.g., N-body 107, 107', P-body 116, 116') can be implanted/diffused to define source regions (e.g., N-channel devices use N-type doping (e.g., N-body) 107 and P-channel devices use P-type doping (P-body) 116). A source contact conductive layer 101 (or FIG. 1b, 101') can be deposited connecting source and body regions (e.g., P-body 106/N-body 107 or N-body 115/P-body 116) forming a portion of an electrical conductive path (shown as one segment of dashed lines through these areas) for an electrical power supply (not shown). A dielectric material (e.g., a gate oxide 108) can be placed on top of epitaxial region (N type silicon 103) and over/between N source 107 and N source 107'. In FIG. 1a, MOS gate 109 is formed with a conductive layer placed on top of gate oxide 108. A portion of P-Body 105, 105' (FIG. 1a) respectively between N-Source 107 or 107' and N Type Silicon epitaxial layer 103 respectively defines semi-conductive channel regions 111, 111'. Referring to FIG. 1b, a portion of N-Body 114, 114' respectively between P-Source 116 or 116' and the P Type Silicon epitaxial layer 112 respectively defines semi-conductive channel regions 111", 111'''. Dashed lines show electrical conductive paths that are formed during operation of FIGS. 1a and 1b VDMOSFETs.

Attempts have been made, including numerous modifications/improvements in the design, layout, and fabrication of vertical power metal oxide semiconductor field effect transistors (MOSFETs) to enhance their electrical and radiation performance (e.g., increase power density, decrease on-resistance, increase radiation hardness, etc.). For example, radiation-tolerant power, MOSFETs were first introduced to address requirements of various military and space applications. Since then, numerous radiation issues have been discovered and significant research has been devoted to resolving specific radiation issues (e.g., total ionizing dose (TID), single-event gate rupture (SEGR), and SEB issues).

Under some types of MOSFET operation, application of an appropriate gate voltage (a gate voltage greater than the device's gate threshold voltage) forms a conducting path between source and drain allowing current to flow (device is turned on). Higher gate voltages equates to higher current flow. One effect of TID is to trap charge in gate oxide, which causes MOS gate threshold voltage to shift (e.g., gate voltage required to turn on the device can change with TID). If this TID-induced shift is sufficiently large, n-channel devices cannot be turned off and become non-functional. When threshold voltage of re-channel device shifts below zero volts and becomes negative (e.g., n-channel devices have positive threshold voltages), that device is said to have failed by going into depletion mode. An exemplary MOS gate threshold voltage shift of p-channel devices has an opposite effect. P-channel devices become impossible to turn-on without applying an excessive gate voltage that can damage device. Methods have been attempted to help resolve TID issues in power MOSFETs. One method seeks to decrease gate oxide thickness (e.g., a thinner gate oxide traps less charge but makes device more susceptible to SEGR). Another method seeks to ensure high quality of final gate oxide by manufacturing radiation-hardened gate oxides but these rad-hard oxides can be expensive and exhibit variability in radiation hardness from processing lot to processing lot. Another method seeks to apply higher gate voltages to turn-on or turn-off the device but threshold voltages can shift beyond a safe operating voltage; higher gate voltages can also make devices more susceptible to SEGR.

FIGS. 3a and 3b represent a simplified cross sectional view of a basic design/layout of N-channel and P-Channel Metal-Semiconductor Field Effect Transistors (MESFETs), respectively (the exemplary structure is cut parallel to the drain and source and along the MESFET gate). Unlike MOSFETs, the MESFETs use a reverse biased schottky diode to control current flow by modulating the depletion layer width. The MESFET consists of a doped semiconductor layer (N-Channel MESFETs use N-Type Substrates 122; whereas, P-Channel MESFETs use P-Type Substrates 123). A conductive layer can be deposited onto opposite ends of substrate forming the drain contact 120 and source contact 121 of the MESFET. Toward a middle of 122 or 123, a region using a certain metal or silicide such as molybdenum, platinum, chromium, tungsten, platinum silicide, palladium silicide is deposited onto a substrate forming a schottky diode which forms a MESFET gate contact 118.

Unlike MOSFETs, MESFETs exhibit a natural hardness to TID radiation. TID issues in MOSFETs are directly related to trapped charge in gate oxide used to modulate conductive channel; whereas, MESFETs do not use dielectric materials to form a conductive channel making it naturally hard to TID.

Power MOSFETs subjected to space-like environments or other particle-enriched environments are prone to SEGR and SEB, which can adversely affect the device's performance and may even cause system failure. For SEB, a main area of concern is the interaction of a charged particle with the inherent parasitic bipolar transistor where the source acts like an emitter, the body acts like a base and the drain acts like a collector (e.g., see FIG. 4). For SEGR, the main area of concern is the interaction of a charged particle strike within neck region defined by the epitaxial region under the gate oxide between adjacent body regions (e.g., see FIG. 4). When a charge particle traverses a semiconductor material, it sheds energy in accordance with its linear energy transfer (LET) function for that material and that energy can create electron-hole pairs along particle's path. In presence of an electric field, these electron-hole pairs can separate producing unwanted current flow. A resultant current flow under certain conditions can lead to SEB or SEGR. SEB can occur if this current flow is sufficient to locally turn on the parasitic bipolar transistor which if not interrupted may lead to thermal runaway (device fails catastrophically). SEB mechanisms can be more complex than presented here but the intent is to only provide a cursory explanation of SEB. SEGR can occur if this current flow disrupts the depletion field in the epitaxial layer under the gate and couples a portion of the drain potential across the gate dielectric sufficient to damage gate dielectric (e.g., see FIG. 5). SEGR mechanisms can be more complex than presented here but the intent is to only provide a cursory explanation of SEGR.

Some high-voltage applications involving RF mixers, amplifiers, gain control, and detectors may employ two devices to perform the intended application. If an electrical circuit uses two devices to accomplish the intended application, there can be added costs, more space, and added weight when compared to a single device option.

One exemplary embodiment of the invention, such as a planar Dual-Gate Vertical Double-Diffused Metal Oxide Semiconductor Field Effect Transistor (DGVDMOSFET), can be a layout/design of an innovative structure integrating and combining aspects of improved VDMOSFETs with an operational gate of a MESFET or schottky gate. Therefore, an exemplary improved DGVDMOSFET has advantages of both VDMOSFETs and MESFETs creating an exemplary innovative new device and related methods thereof: the DGVDMOSFET. Presently, dual-gate MOSFETs can be built by packaging two MOSFETs into a hybrid-type package with two MOSFETs placed in series but this implementation does not address radiation issues and increases overall cost, weight and size. Another implementation can be to fabricate two lateral MOSFETs in series using a monolithic type layout. However, use of lateral MOSFETs can limit a drain-to-source blocking voltages of such devices to applications that are typically less than 100V due to surface area considerations (blocking voltage is basically determined by the lateral spacing between drain and source and doping) and does not address radiation issues. Drain-to-source blocking voltage of the VDMOS can be determined by the epitaxial layer thickness and doping; therefore, an exemplary DGVDMOSFET can be fabricated for blocking voltages that exceed 1000V providing a new device for high-voltage applications. This exemplary device can be useful in RF type applications such as mixers, gain control, amplifiers, and detectors.

Exemplary embodiments of the invention, e.g., DGVDMOSFET, can also enhance operational performance in radiation environments, specifically SEB, SEGR, and TID environments. Existing power VDMOSFETs can be prone to catastrophic failure from SEB and SEGR, if operated in radiation environments where particles such as neutrons, protons, and heavy ions are present. An exemplary DGVDMOSFET structure can provide an enhanced barrier (e.g., enhanced depletion region) to reduce interactions of radiation particles with exemplary embodiments of the invention from suffering from SEB and SEGR conditions. Existing power VDMOSFETs can also be prone to TID-induced threshold voltage (VTH) shifts from ionizing radiation environments, which can lead to device failure in their intended application. An exemplary embodiment's independent MESFET gate can provide a radiation hardened by design (RHBD) approach to reduce TID effects providing enhanced operational performance beyond an operational failure point of VDMOSFETs (e.g., an exemplary improved MESFET gate can allow the exemplary structure to be turned off even after the MOS gate becomes non-functional from TID-induced threshold voltage shifts).

FIG. 6 provides one simplistic application of a dual gate transistor e.g., DGVDMOSFET 200 or 200', used in a RF mixer circuit. Dual gate transistors can be useful in many types of RF applications.

Additional features and advantages of the present invention will become apparent to those skilled in the art upon consideration of the following detailed description of the illustrative embodiment(s) exemplifying some best modes of carrying out the invention as presently perceived.

BRIEF DESCRIPTION OF THE DRAWINGS

The detailed description of the drawings particularly refers to the accompanying figures in which:

FIG. 6 shows a simplified dual gate transistor used in an exemplary RF mixer application;

DETAILED DESCRIPTION OF THE DRAWINGS

The embodiments of the invention described herein are not intended to be exhaustive or to limit the invention to precise forms disclosed. Rather, the embodiments selected for description have been chosen to enable one skilled in the art to practice the invention.

One exemplary embodiment of the invention describes a design/layout of an innovative device, a DGVDMOSFET, which allows dual gate control of a modified VDMOSFET to be fabricated into a monolithic device (integrate improved elements and functions within a combined VDMOSFET and MESFET). An exemplary DGVDMOSFET has dual independent gates to control current between drain and source. An embodiment includes an exemplary basic fabrication steps (design/layout) of an exemplary DGVDMOSFET incorporating aspects of improvements to a planar VDMOSFET.

Figure 1A:
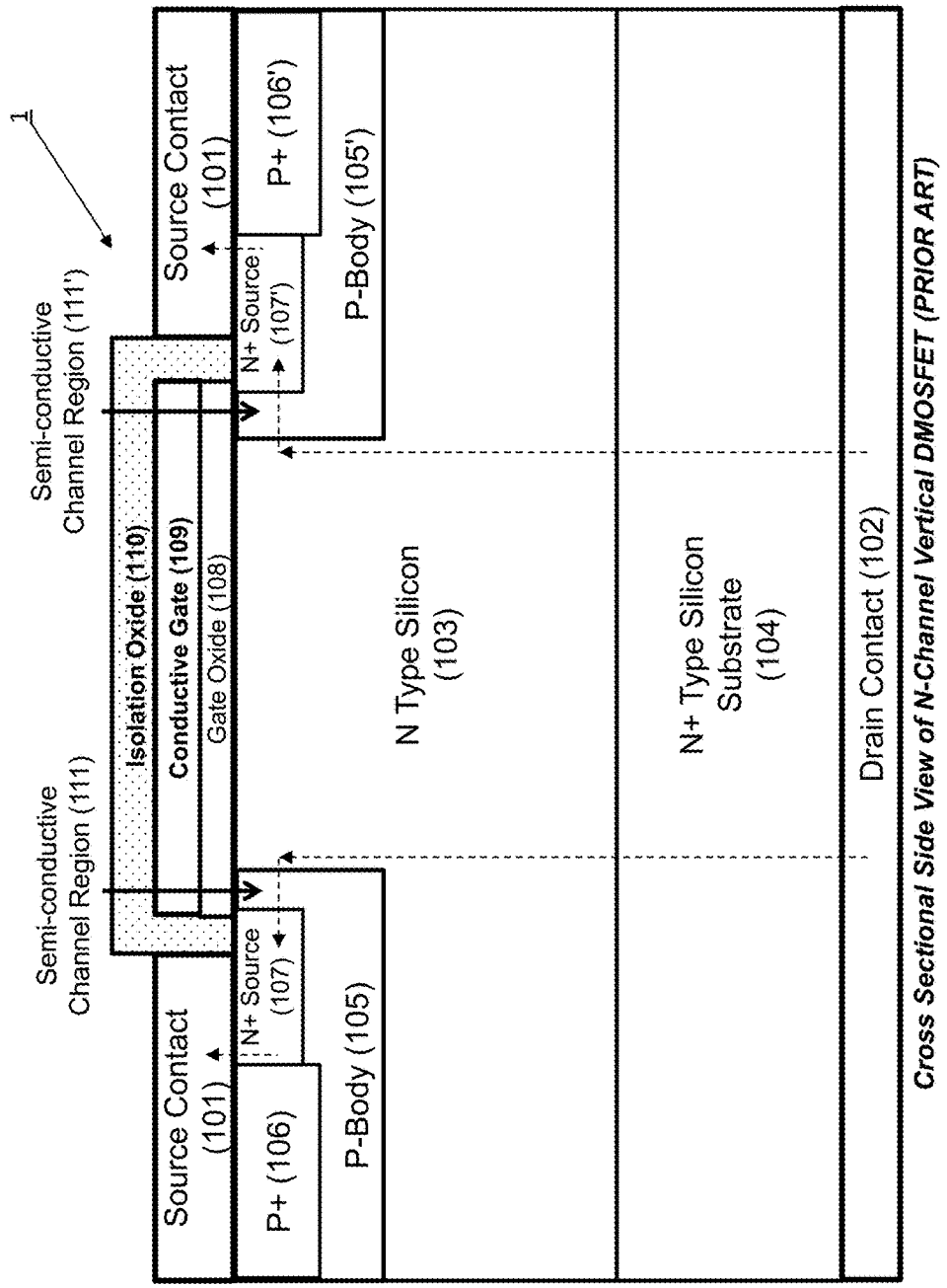
FIG. 1*a* shows a simplified cross sectional side view of a N-channel VDMOSFET.
Figure 1B:
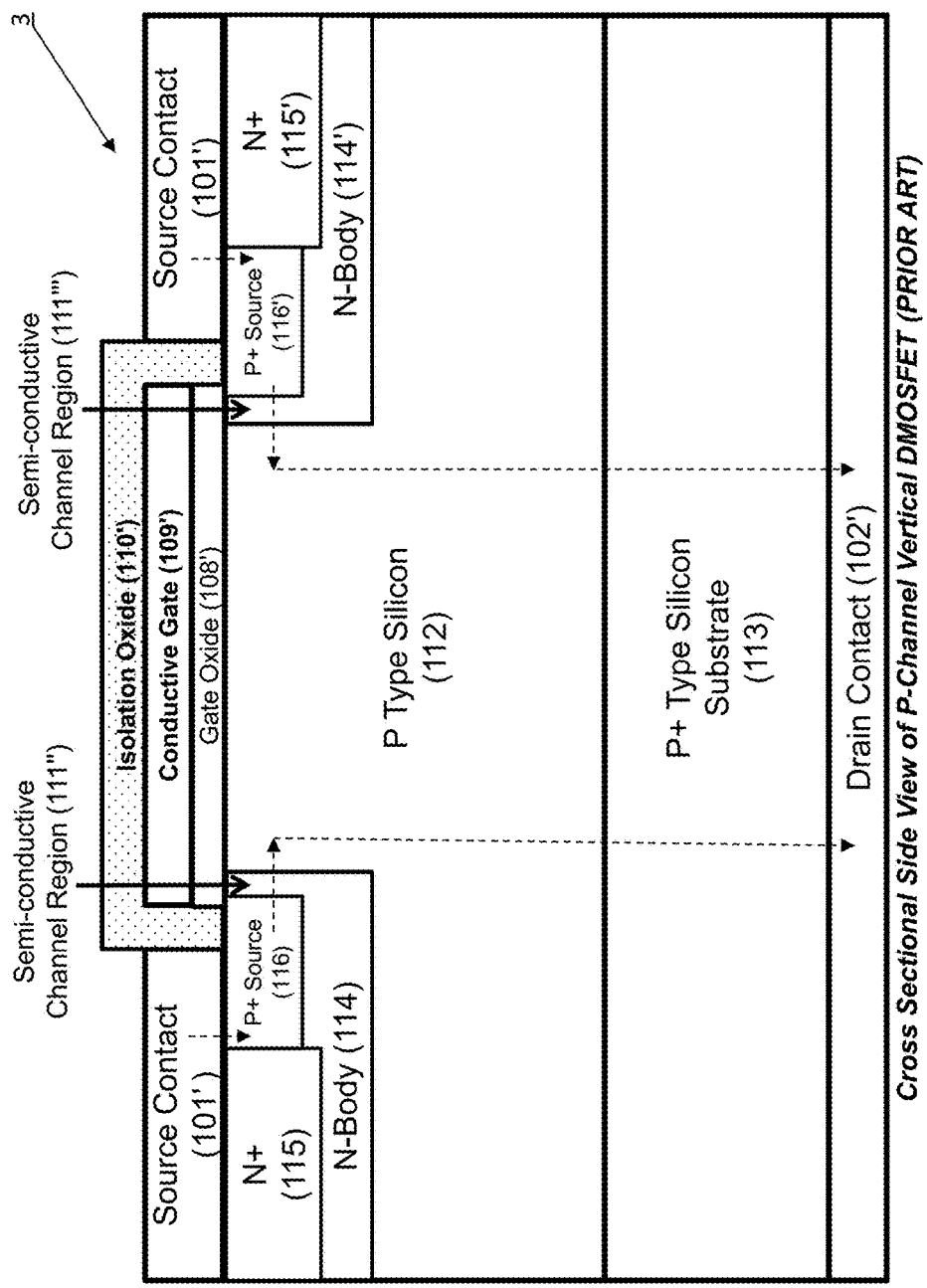
FIG. 1*b* shows a simplified cross sectional side view of a P-channel VDMOSFET.
Figure 2A:
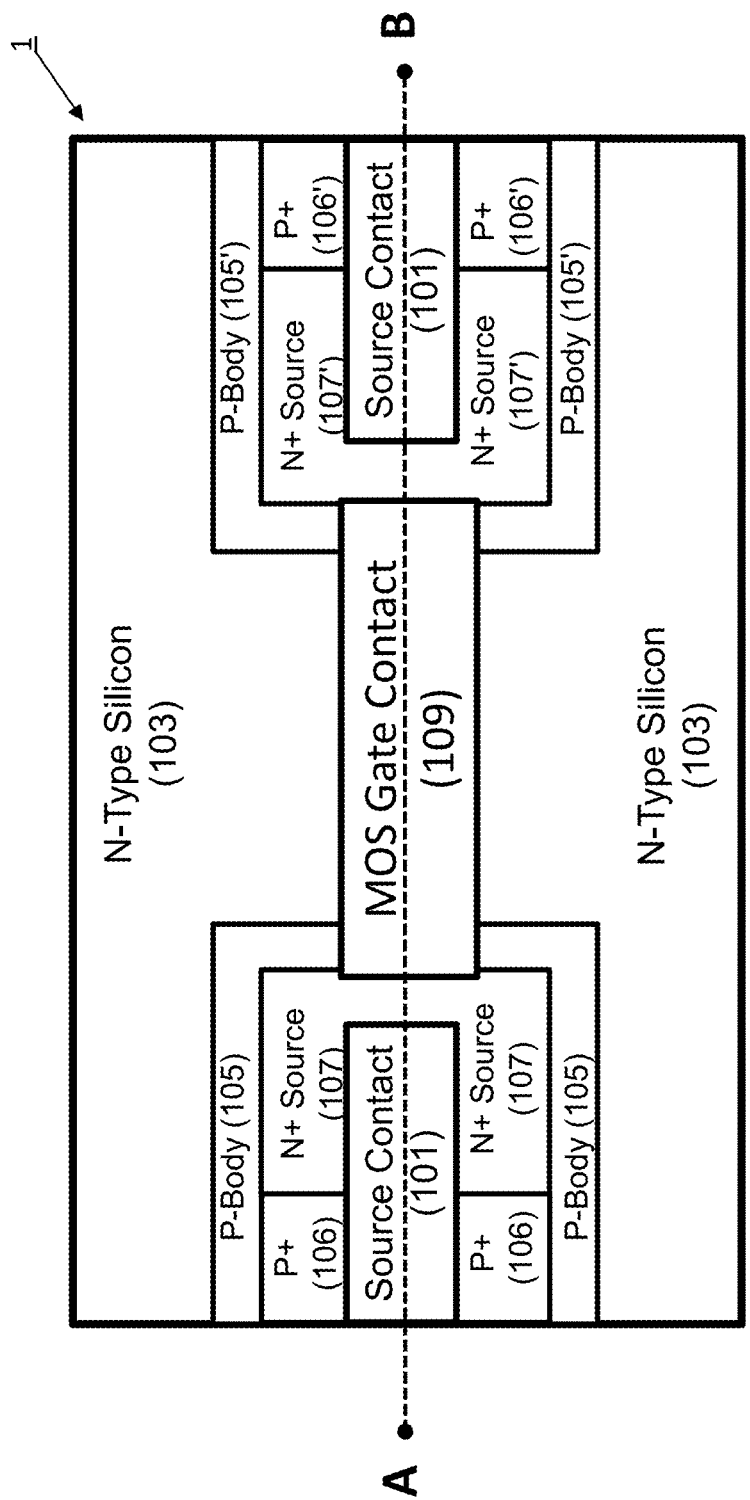
FIG. 2*a* shows a simplified top view of the FIG. 1*a* N-channel VDMOSFET.
Figure 2B:
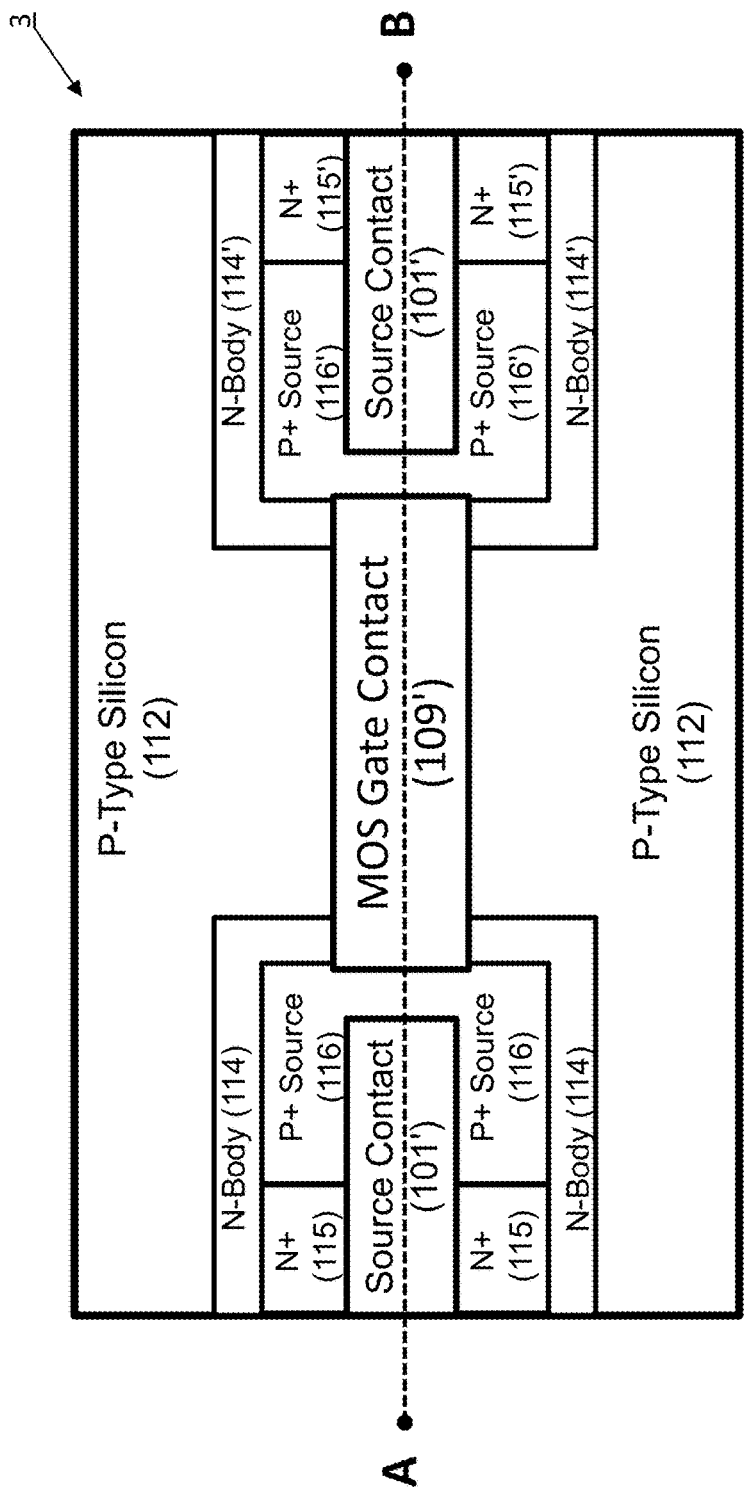
FIG. 2*b* shows a simplified top view of the FIG. 1*b* P-channel VDMOSFET.
Figure 3A:
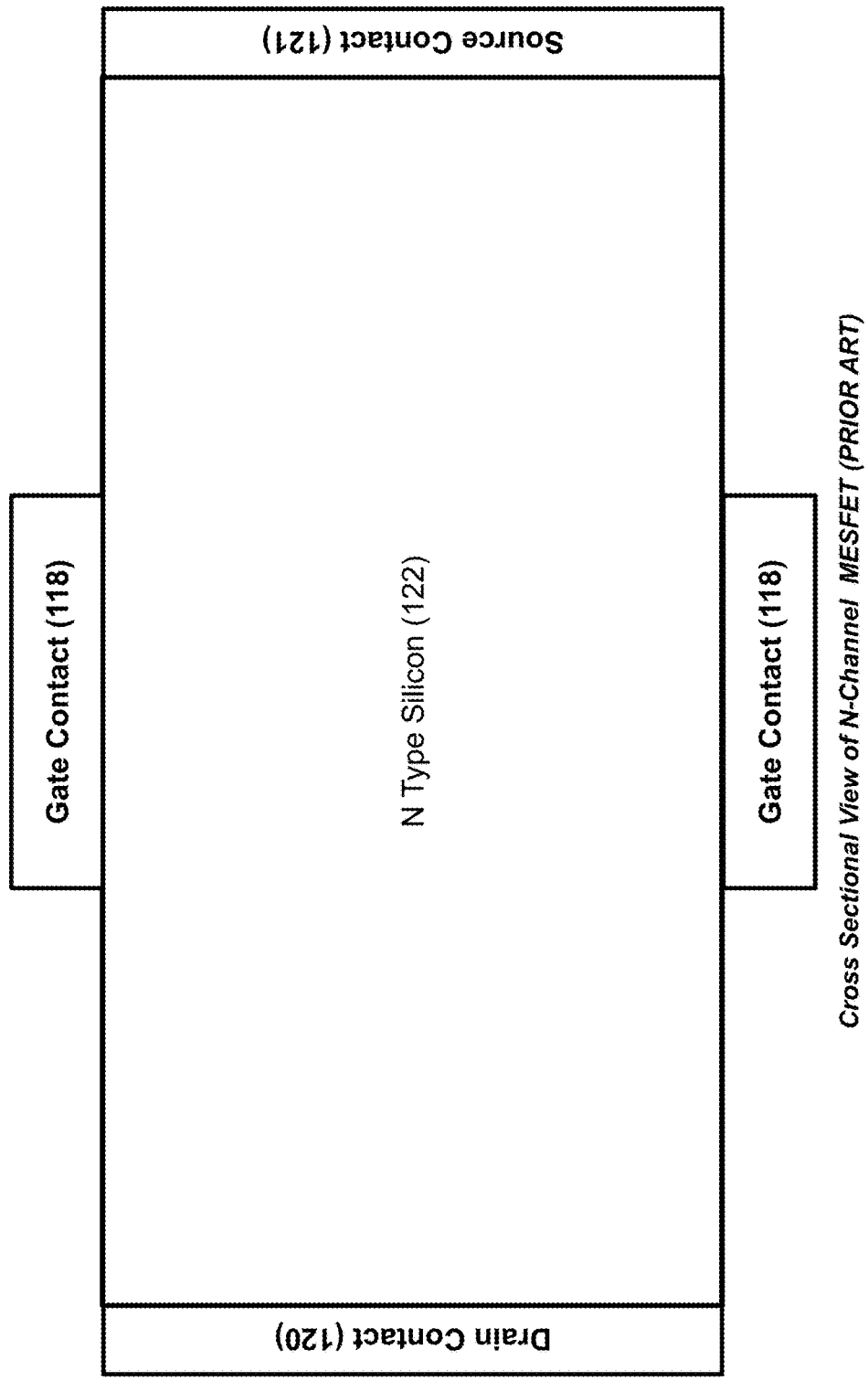
FIG. 3*a* shows a simplified cross sectional view of a N-channel MESFET.
Figure 3B:
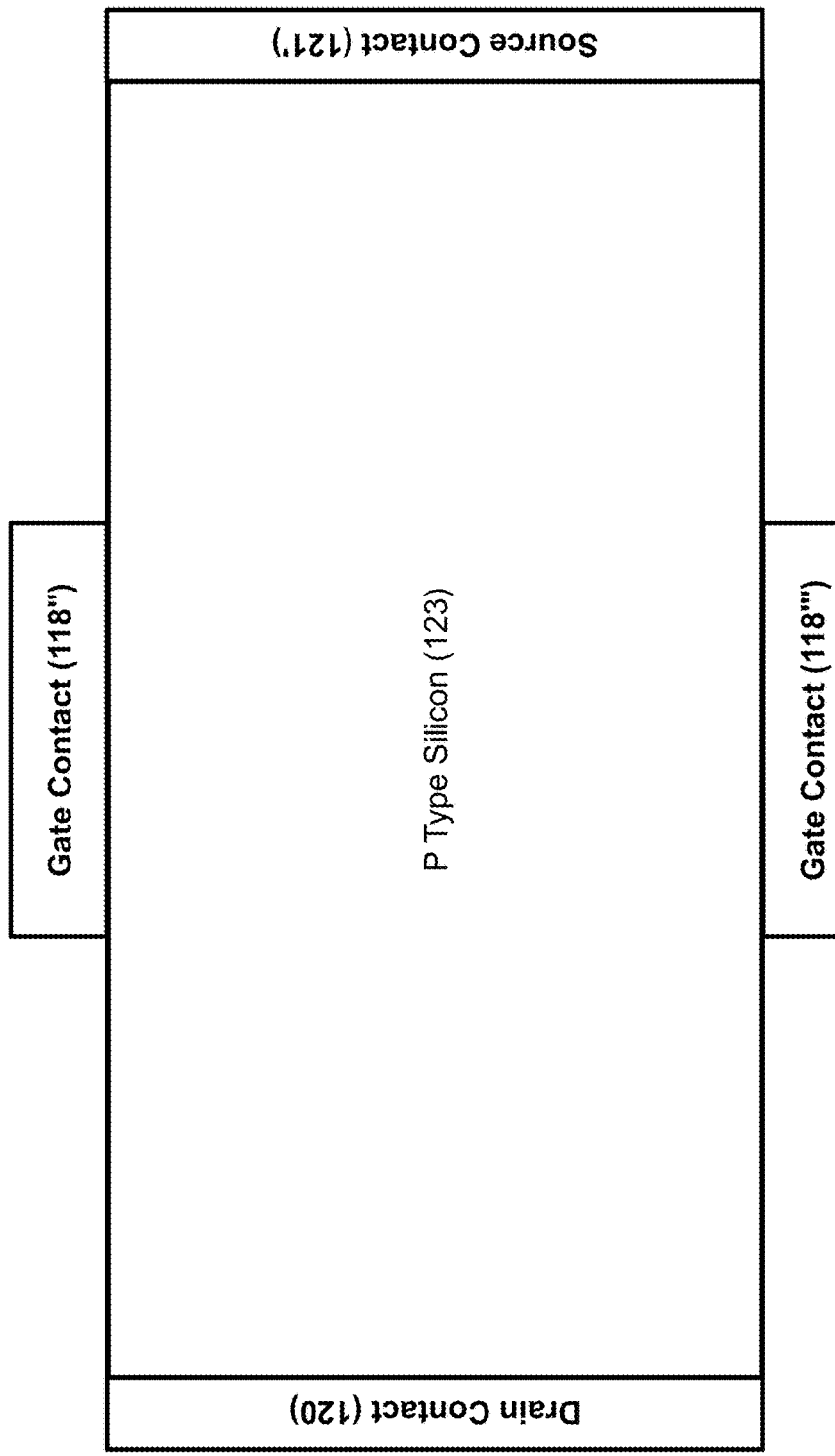
FIG. 3*b* shows a simplified cross sectional view of a P-channel MESFET.
Figure 4:
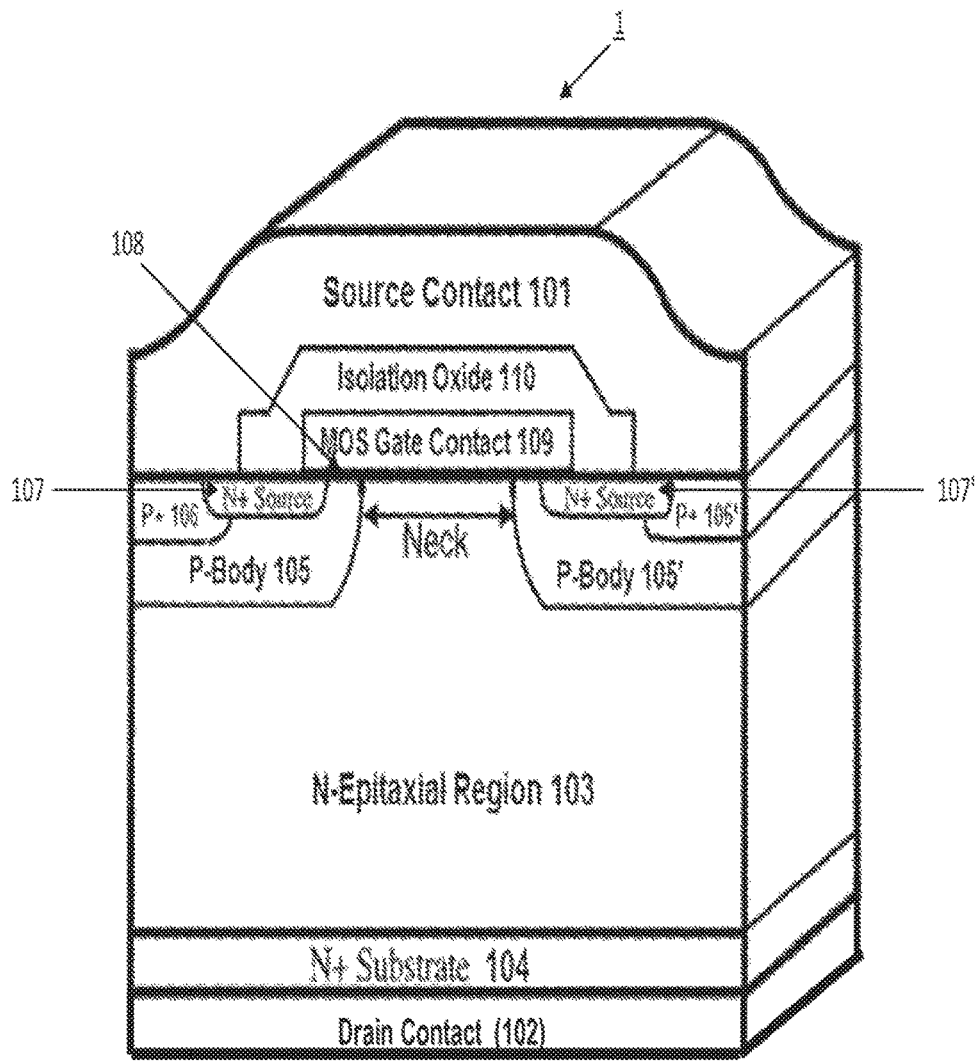
FIG. 4 shows a simplified three-dimensional cross-sectional view of the FIG. 1*a* N-channel VDMOSFET showing parasitic bipolar and neck region.
Figure 5:
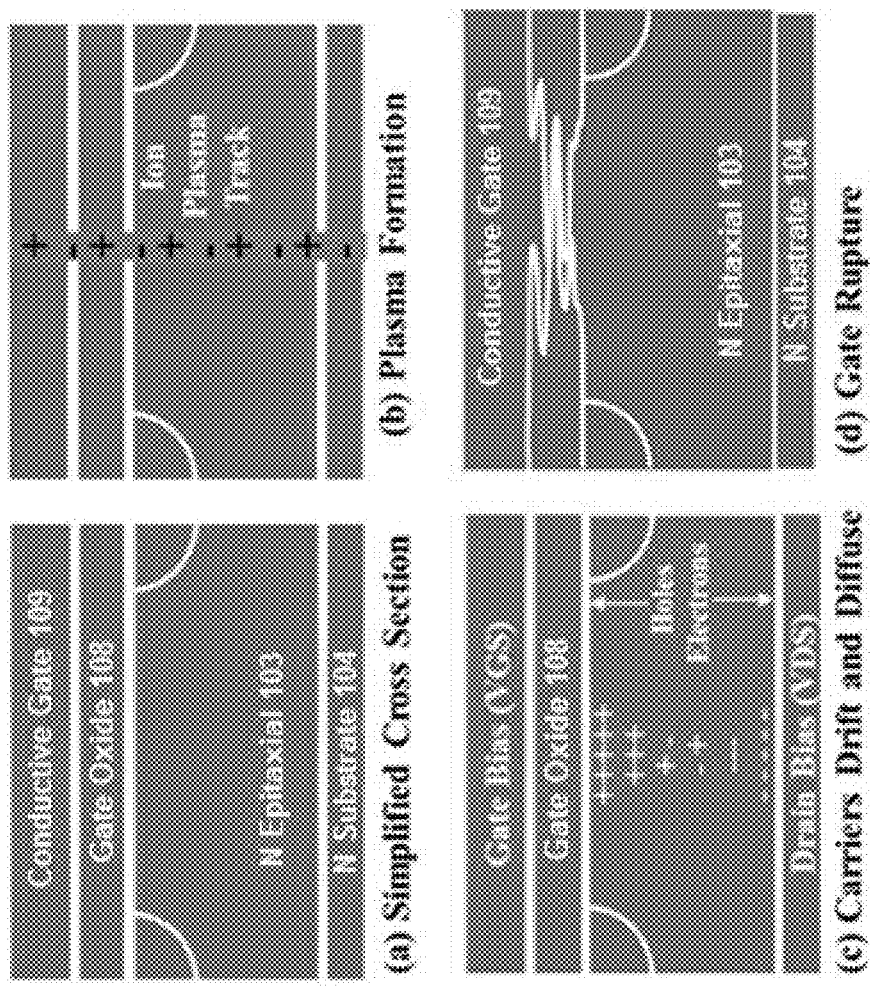
FIG. 5 shows a simplified pictorial evolution of SEGR stages of a simplified N-channel VDMOSFET such as shown in FIG. 1*a*.
Figure 7A:
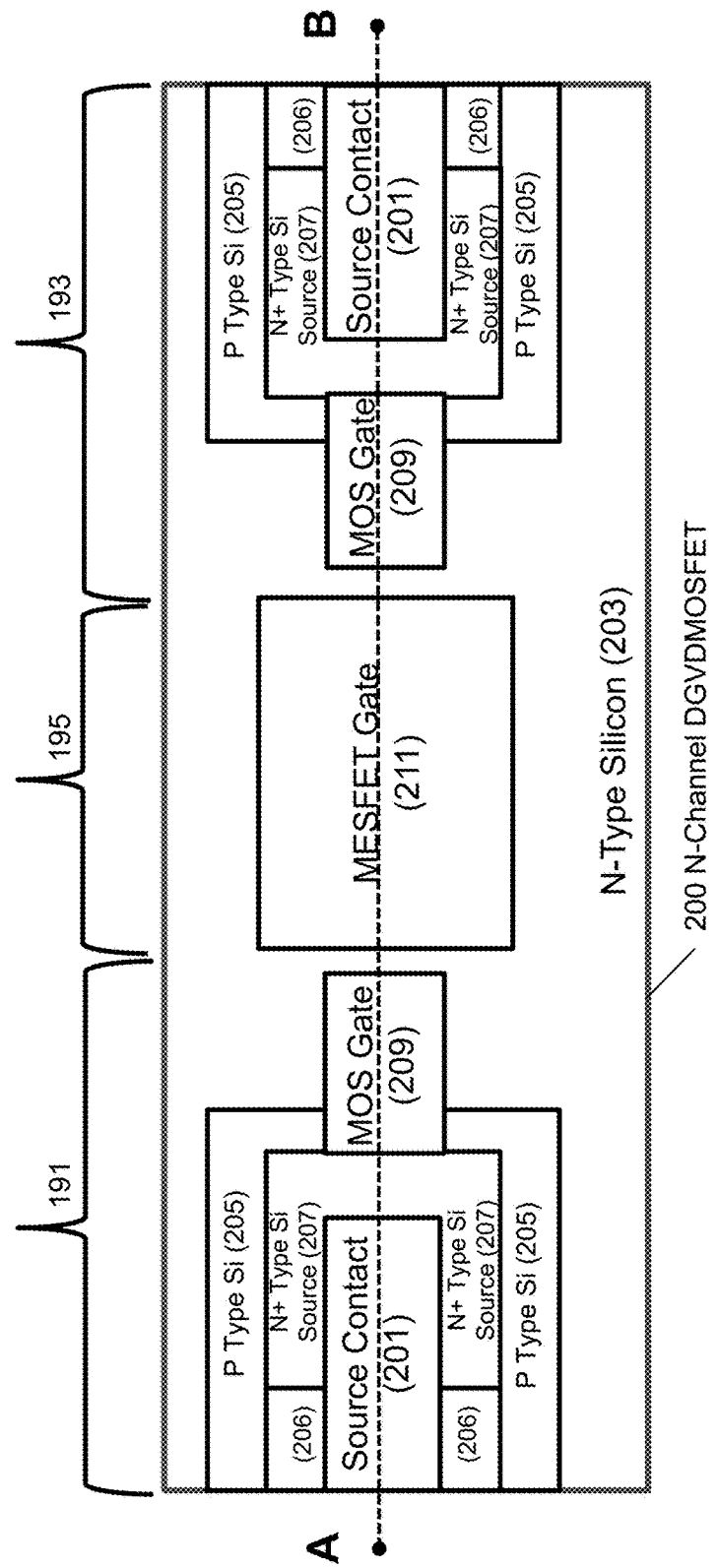
FIG. 7*a* shows a simplified cross sectional view of an exemplary N-channel DGVDMOSFET in accordance with one embodiment of the invention.
Figure 7B:
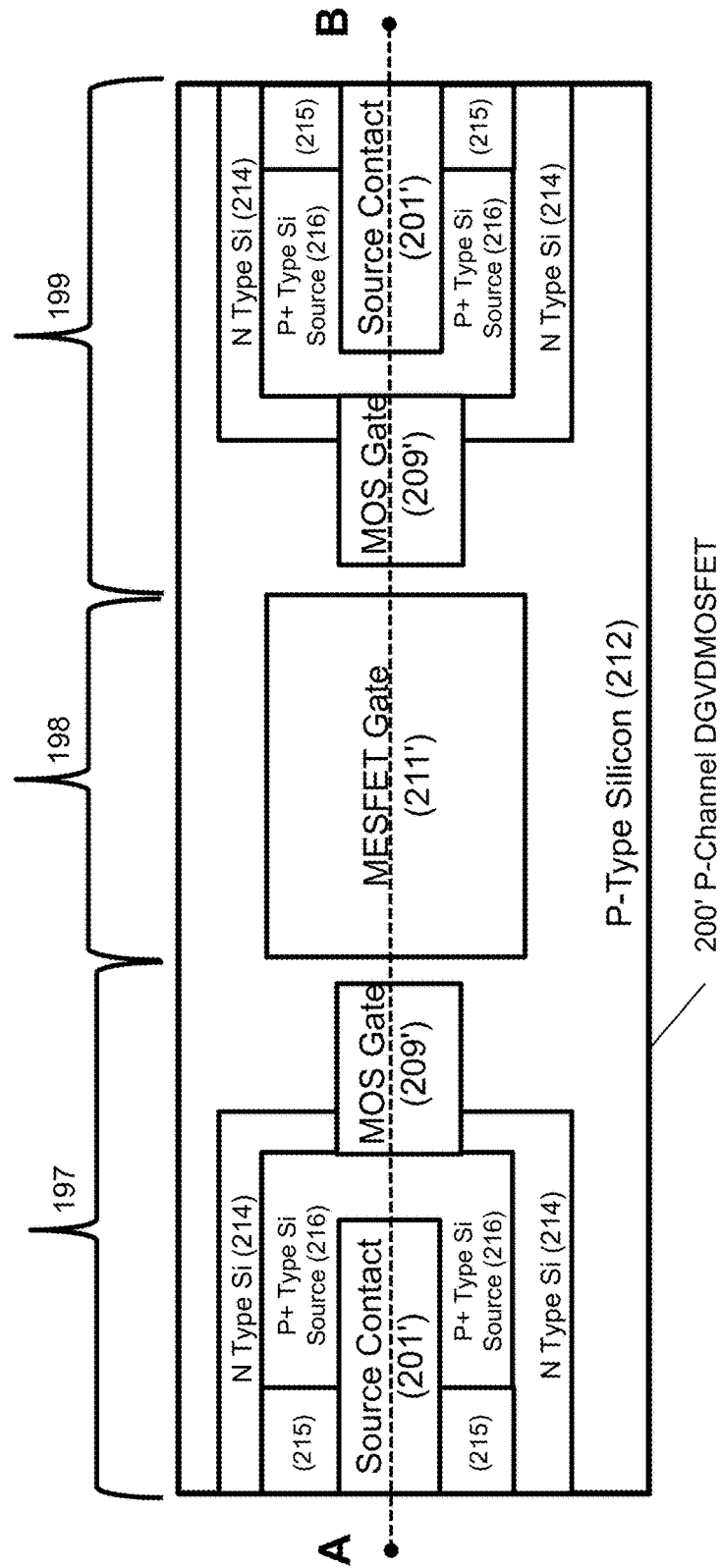
FIG. 7b shows a simplified cross sectional view of an exemplary P-channel DGVDMOSFET in accordance with one embodiment of the invention.

FIGS. 7a and 7b represents simplified top-views of cutaway cross-sectional views of two exemplary DGVDMOSFETs 200 (N-channel version), 200' (P-channel version) that includes a MESFET structure, e.g., 211 (FIG. 7a) or 211' (FIG. 7b). The DGVDMOSFET (e.g., 200, 200') design/layout can be fabricated using stripe; rectangular; hexagonal; and other commonly used cell layout schemes. The FIGS. 7a, 7b views are simplified cutaways showing a lateral slice view of these devices versus a three-dimensional view of a device as shown in FIG. 4. Many cells (e.g., DGVDMOSFET 200 and/or 200') can be integrated in parallel providing different current and on-resistance capabilities depending upon number of cells integrated together.

FIG. 7a includes a N-Type Silicon (203) epitaxial layer formed with a MOSFET structure section having a first and second portions 191, 193 (comprising 209/201/205/207 and 209/201, 205/207) with the MESFET 195 (comprising 211) formed between the two MOSFET structure portions 191, 193. The first MOSFET portion 191 includes a MOS Gate 209 disposed with one section over a P-Body 205 and an N+ Type Source section 207 where a Source Contact 201 is disposed within the N+ Type Source section 207. The N+ Type Source section 207 is disposed within the P-body 205 section. The second MOSFET portion 193 includes a section of MOS Gate 209 (in this example MOS Gate 209s are coupled in a three-dimensional structure connecting them which are not shown due to the cutaway nature of this view) which is disposed with one section over the P-Body 205 and the N+ Type Source section 207 where the Source Contact 201 is disposed within the N+ Type Source section 207. The N+ Type Source section 207 is disposed within the P-body 205 section (in this example both P-bodies 205/205, Source Contacts 201, and N+ Type Sources 207 are coupled in a three-dimensional structure connecting them which is not shown due to the cutaway nature of this view). The first and second MOSFET structure portions 191, 193 and the MESFET 195 section are disposed within an N-Type Silicon epitaxial layer 203.

FIG. 7b includes a P-Type Silicon (212) epitaxial layer formed with a MOSFET structure section having a first and second portions 197, 199 (comprising 209'/201'/214/216 and 209'/201'/214/216) with the MESFET 198 (comprising 211') formed between the two MOSFET structure portions 197, 199. Both FIGS. 7a and 7b have a cut line (A-B) representing a vertical cut line which defines respective views in FIGS. 8a and 8b. The first MOSFET portion 197 includes a section of a MOS Gate 209' disposed with one section over a N-body 214 and an P+ Type Source section 216 where a Source Contact 201' is disposed within the P+ Type Source section 216. The P+ Type Source section 216 is disposed within the N-Body 214 section. The second MOSFET portion 199 includes the MOS Gate 209' section (in this example both MOS Gate 209' sections are coupled in a three-dimensional structure which is not shown connecting them due to the cutaway of this view) which is disposed with one section over the N-Body 214 and the P+ Type Source section 216 where the Source Contact 201' is disposed within the P+ Type Source section 216. The P+ Type Source section 216 is disposed within the N-body 214 section. (in this example, N-bodies 214/214, Source Contacts 201', and P+ Type Sources 216 are coupled in a three-dimensional structure which is not shown connecting them due to the cutaway nature of this view). The first and second MOSFET structure portions 197, 199 and the MESFET 198 section are disposed within a P-Type Silicon epitaxial layer 212. In this exemplary embodiment, the MESFET section 198 is disposed within the P Type epitaxial layer 212 such that it decouples the MOSFET section 197, 199 on either side of it and is disposed so that the MESFET section's 198 outer boundary is in proximity to an outer boundary section of one side of both MOSFET sections 197, 199 on either side of the MESFET section 198.

Figure 8A:
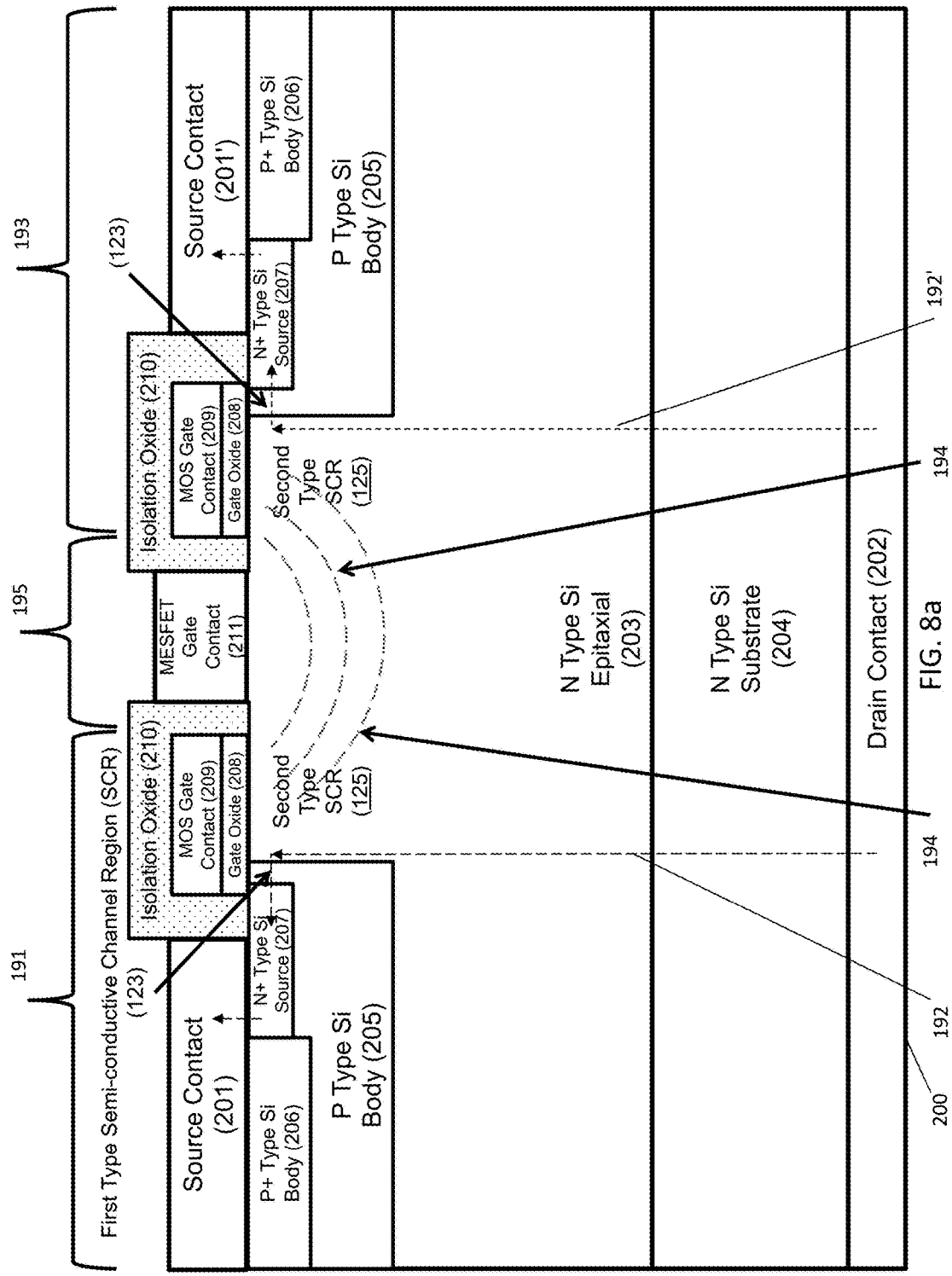
FIG. 8a shows a simplified cross sectional side view of an exemplary N-channel DGVDMOSFET in accordance with one embodiment of the invention.

FIG. 8a shows a simplified side cross-sectional view of the exemplary FIG. 7a N-channel DGVDMOSFET along FIG. 7a A-B cut lines in accordance with one embodiment of the invention. FIG. 8a adds elements to the FIG. 7a structure that cannot be seen in the top cross-sectional cutaway view. For example, FIG. 8a shows two Gate Oxide 208 sections respectively disposed between both MOS Gate Contact 209 sections and N+ Type Source 207/P-Body 205 sections/N Type epitaxial layer 203. Two categories of semi-conductive channel regions (SCR) are shown 123, 125. A First Type SCR 123 is created as a result of design of the MOSFET sections 191, 193—for example, SCR 123 can be a region in lateral proximity to the N+ Source Type 207 that is underneath a portion of Gate Oxide area 208 and a section of P-Body 205 that is underneath a portion of Gate Oxide 208 that is next to a boundary section of N Type epitaxial layer 203. A Second Type SCR 125 is formed in another region 125, e.g., underneath a section of Gate Oxide 208 and disposed between P-Body 205 and a section of MESFET 195, e.g., MESFET gate contact 211 or schottky diode of MESFET 195 section. A MESFET Gate Contact 211 is shown in contact with N Type Epitaxial Layer 203. In this example, dashed grey-lines 194 are shown which exemplify production of an electrical field effect created by MESFET section 195 when it is biased with an electrical power supply. Two sets of black dashed lines 192, 192' show two separate exemplary electrical paths that are controlled by the MOSFET sections 191, 193. In this example, there are two First Type SCRs 123 formed at a boundary section of both MOSFET sections in proximity to the N Type epitaxial layer 203. In this example, there are two Second Type SCRs 125 formed as a result of the FIG. 7a/8a design on either side of the MESFET section 195 and between the two MOSFET sections 191, 193. In this embodiment, the First Type SCRs 123 respectively regulates current through the MOSFET sections 191, 193. The Second Type SCRs 125 perform a second current regulation function associated with electrical signals passing through the MOSFET by opening or closing a semi-conductive path in a section of the N-Type epitaxial layer 203. These dual SCR regions (123/125) provides two independent gate type functions or capabilities that are useful for mixing signals as well as providing benefits from a radiation hardening or performance perspective. The MOSFET 191, 193 sections are sensitive to radiation degradation which can be compensated for or eliminated by use of the Second Type SCR 125 by means of the electrical field effect 194 passing through the epitaxial layer 203 which reduces or cuts off electrical flow path 192/192'. Various negative effects can be mitigated or eliminated by embodiments of this invention such as TID, SEB, and SEGR. As an example, TID effects can cause the First Type SCR 123 to be permanently turned on; however, TID effects do not fully or partially affect the Second Type SCR 125. Also, radiation induced currents can cause failure of the MOSFET sections 191, 193; an addition of the MESFET structure 195 reduces radiation induced current through these MOSFET sections 191, 193 facilitating increased radiation tolerance. Additional elements shown in FIG. 8a include N Type substrate 204 disposed beneath the N Type epitaxial layer 203 as well as a drain contact 202 disposed beneath the N Type substrate 204.

Figure 8B:
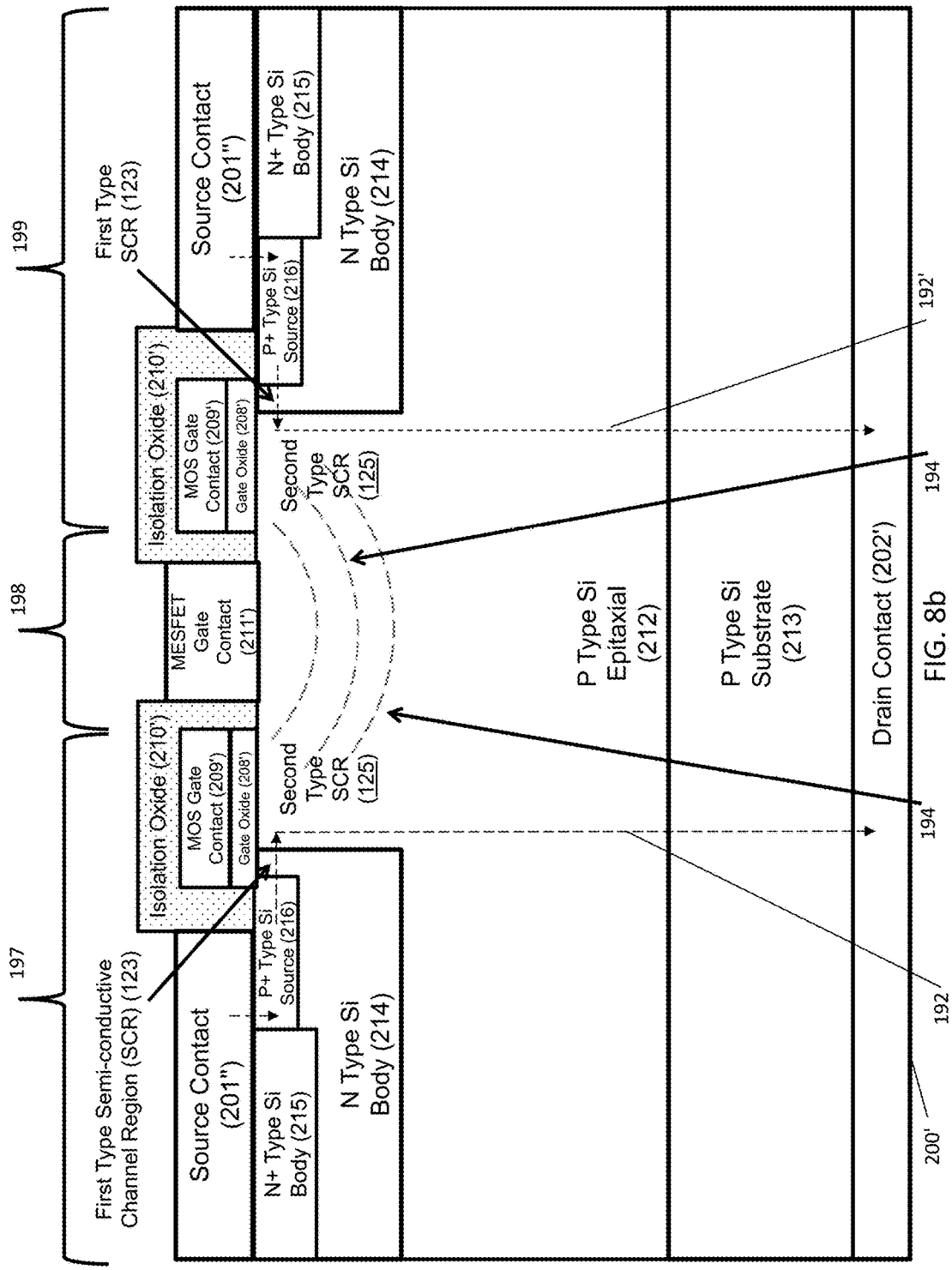
FIG. 8b shows a simplified cross sectional side view of an exemplary P-channel DGVDMOSFET in accordance with one embodiment of the invention.

FIG. 8b shows a simplified side cross sectional view of the exemplary FIG. 7b P-channel DGVDMOSFET along FIG. 7b A-B cut lines in accordance with one embodiment of the invention. FIG. 8b adds elements to the FIG. 7b structure that cannot be seen in the top cross-sectional cutaway view. The FIG. 8b structure differs from the FIG. 8a design in that references to N type silicon becomes P-type silicon references and references to P type silicon become N-type references. Different elements numbers are also used for elements which are different in structure or material composition to the FIG. 8a design. References to the first and second MOSFET sections 197, 199 differ as well as MESFET section 198.

For example, FIG. 8b shows two Gate Oxide 208' sections respectively disposed between both MOS Gate Contact 209' sections and P+ Type Source 216/N-body 214 sections/P-Type epitaxial layer 212. Two categories of semi-conductive channel regions are shown 123, 125 which perform a same or similar function as the FIG. 8a structure's SCRs. A First Type SCR 123 is created as a result of design of the MOSFET sections 197, 199—for example, SCR 123 can be a region in lateral proximity to the P+ Source 216, that can be formed underneath a portion of Gate Oxide area 208' and a section of N-Body 214 which is underneath a portion of Gate Oxide 208' that is next to a boundary section of P Type epitaxial layer 212. A Second Type SCR 125 is formed in another region, e.g., underneath a section of Gate Oxide 208' and disposed between N-Body 214 and a section of MESFET 198, e.g., MESFET gate contact 211' or schottky diode contact of MESFET 198 section. A MESFET Gate Contact 211' is shown in contact with P Type Epitaxial Layer 212. In this example, dashed grey-lines 194 are shown which exemplify production of an electrical field effect created by the MESFET section 198 when it is biased with an electrical power supply (not shown). Two sets of black dashed lines 192, 192' shows two separate exemplary electrical paths that are controlled by the MOSFET sections 197, 199. In this example, there are two First Type SCRs 123 formed at a boundary section of both MOSFET sections 197, 199 in proximity to the P Type epitaxial layer 212. In this example, there are two Second Type SCRs 125 formed as a result of the FIG. 7b/8b design on either side of the MESFET section 198 and between the two MOSFET sections 197, 199. In this embodiment, the First Type SCRs 123 respectively regulates current through the MOSFET sections 197, 199. The Second Type SCRs 125 perform a second current regulation function associated with electrical signals passing through the MOSFETs 197, 199 by opening or closing a semi-conductive path in a section of the P-Type epitaxial layer 212. These dual SCR regions (123/125) provides two independent gate type functions or capabilities which are useful for mixing signals as well as providing benefits from a radiation hardening or performance perspective. The MOSFET 197, 199 sections are sensitive to radiation degradation which can be compensated for or eliminated by use of the Second Type SCR 125 by means of the electrical field effect 194 passing through the P type epitaxial layer 212 which selectively reduces or cuts off electrical flow path 192/192'. Various negative effects can be mitigated or eliminated by embodiments of this invention such as TID, SEB, and SEGR. As an example, TID effects can cause the First Type SCR 123 can be permanently turned on; however, TID effects do not fully or partially affect the Second Type SCR 125. Also, radiation induced currents can cause failure of the MOSFET sections 197, 199; an addition of the MESFET structure 198 reduces radiation induced current through these MOSFET sections 197, 199 facilitating increased radiation tolerance. Additional elements shown in FIG. 8b include P Type substrate 213 disposed beneath the P Type epitaxial layer 212 as well as a drain contact 202' disposed beneath the P Type substrate 213.

A control and sensor system could also be provided for (not shown) which would operate embodiments such as the FIG. 7a/8a (and/or 7b/8b) MOSFET 191, 193 (or 197, 199) and the MESFET 195 (or 198) in response to detected radiation fields or energy. For example, a control section can have a pulse width modulator (not shown) which would operate the MOSFET sections 191, 193 (or 197, 199) and MESFET 195 (or 198) in order to reduce or adjust radiation-induced currents or other aspects of operation of this system. A look up table can be utilized by the control section (not shown) which can correlate operation of the MOSFET sections 191, 193 (or 197, 199) and the MESFET section 195 (or 198) which in turn generates effects in the First and/or Second Type SCRs 123, 125 to increase radiation hardening as well as facilitate additional modulation schemes performed by an embodiment of the invention.

Figure 8C:
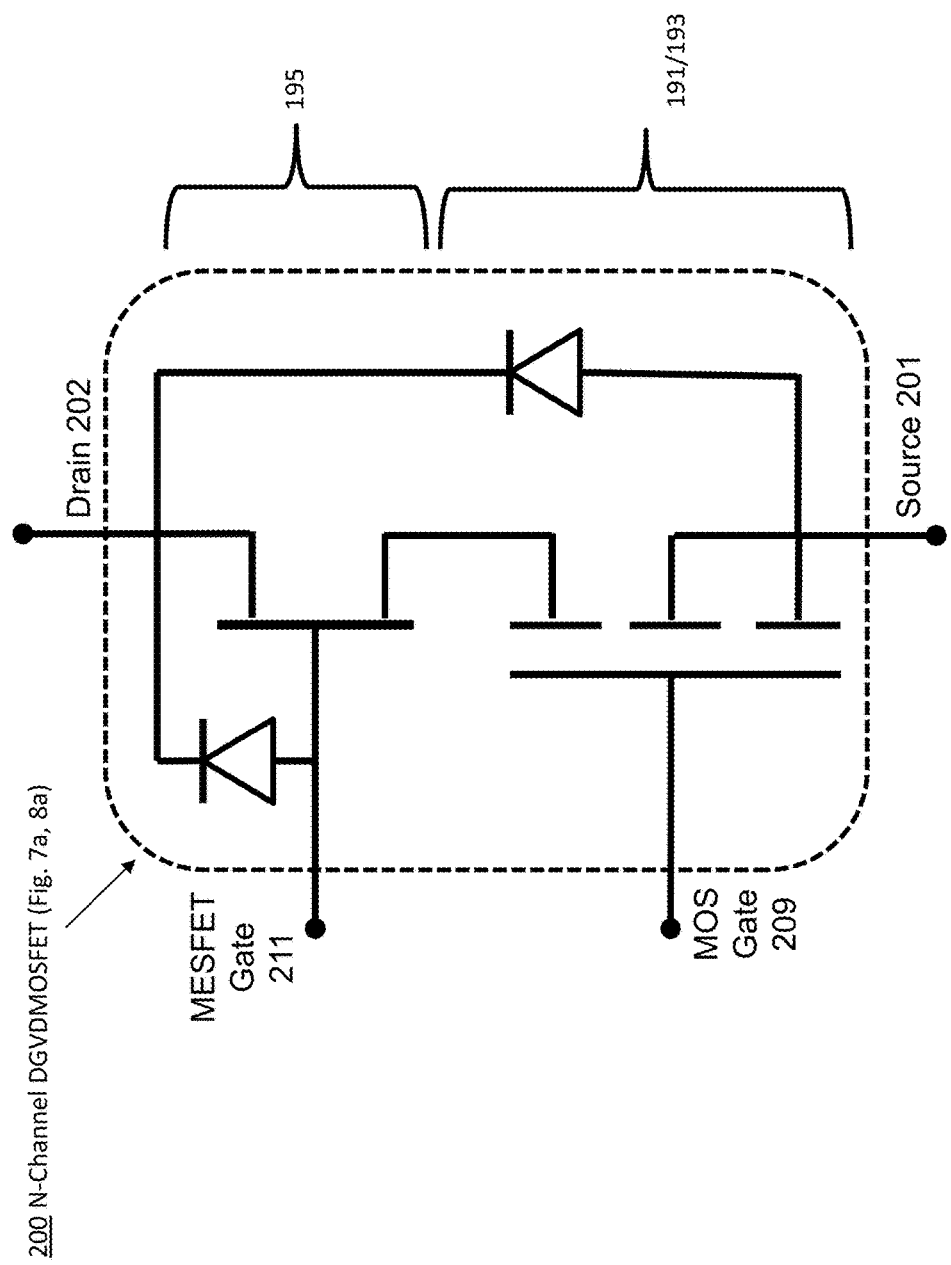
FIG. 8c shows a simplified schematic of N-channel DGVDMOSFET in accordance with one embodiment of the invention.

FIG. 8c shows a simplified schematic of N-channel DGVDMOSFET in accordance with one embodiment of the invention. The FIG. 8c drawing shows an example of a symbolic representation of the FIG. 7a/8a embodiment that shows a combination of the two MOSFET sections 191, 193 as well as the MESFET section 195 as well as input/outputs such as MOS Gate 209, MESFET Gate Contact 211, Source 201, and Drain 202. Additional elements that are optional include two diodes (e.g., parasitic element diodes) that respectively couple drain 202 to source 201; the other diode couples between drain 202 and MESFET gate terminal 211.

Figure 8D:
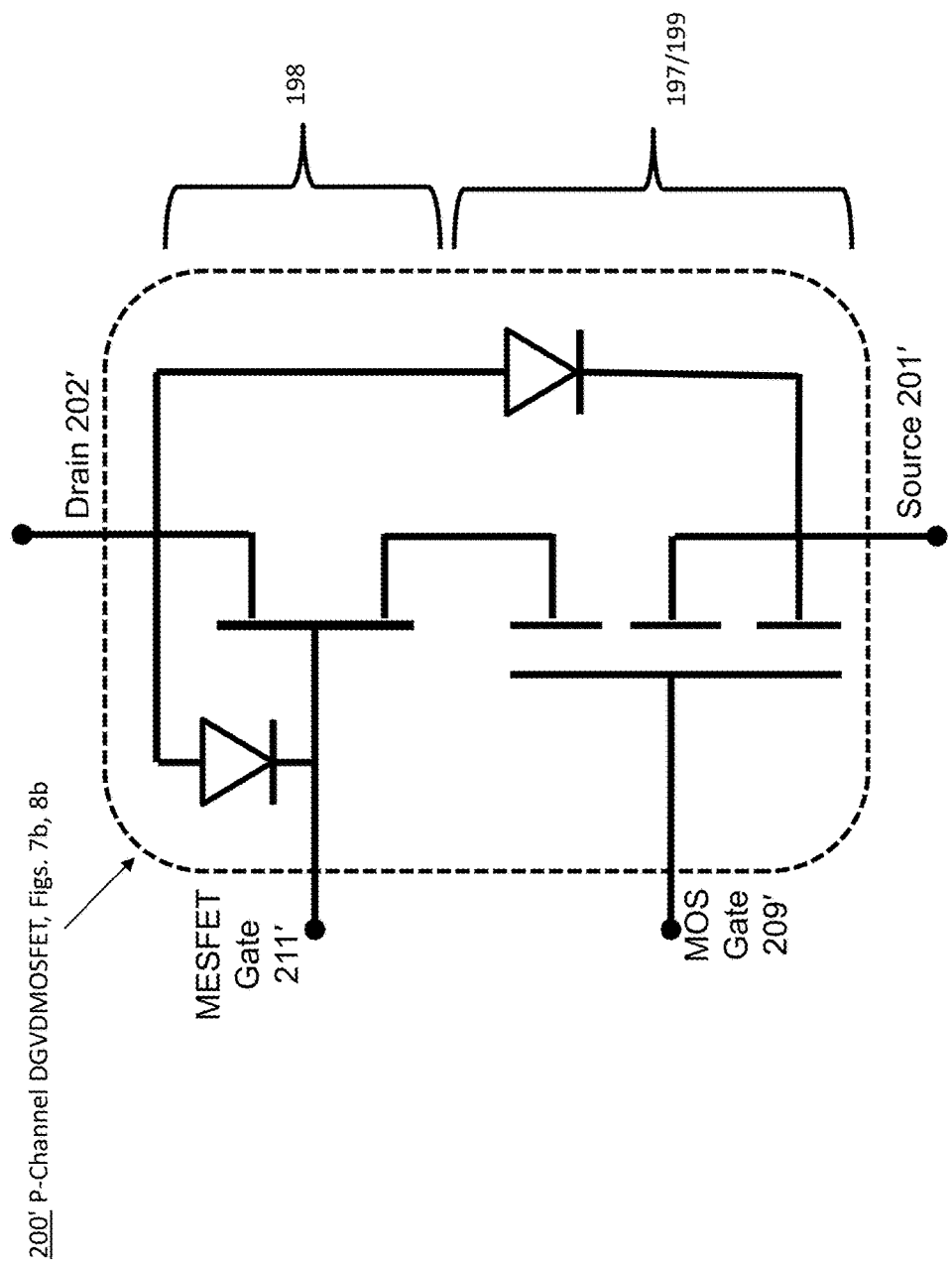
FIG. 8d shows a simplified schematic P-channel DGVDMOSFET in accordance with one embodiment of the invention.

FIG. 8d shows a simplified schematic of P-channel DGVDMOSFET in accordance with one embodiment of the invention. The FIG. 8d drawing shows an example of a symbolic representation of the FIG. 7b/8b embodiment that show a combination of the two MOSFET sections 197, 199 as well as the MESFET section 198 as well as input/outputs such as MOS Gate 209', MESFET Gate Contact 211', Source 201", and Drain 202'. Additional elements that are optional include two diodes (e.g., parasitic element diodes) that respectively couple drain 202' to source 201; the other diode couples between drain 202' and MESFET gate terminal 211'.

Figure 9A:
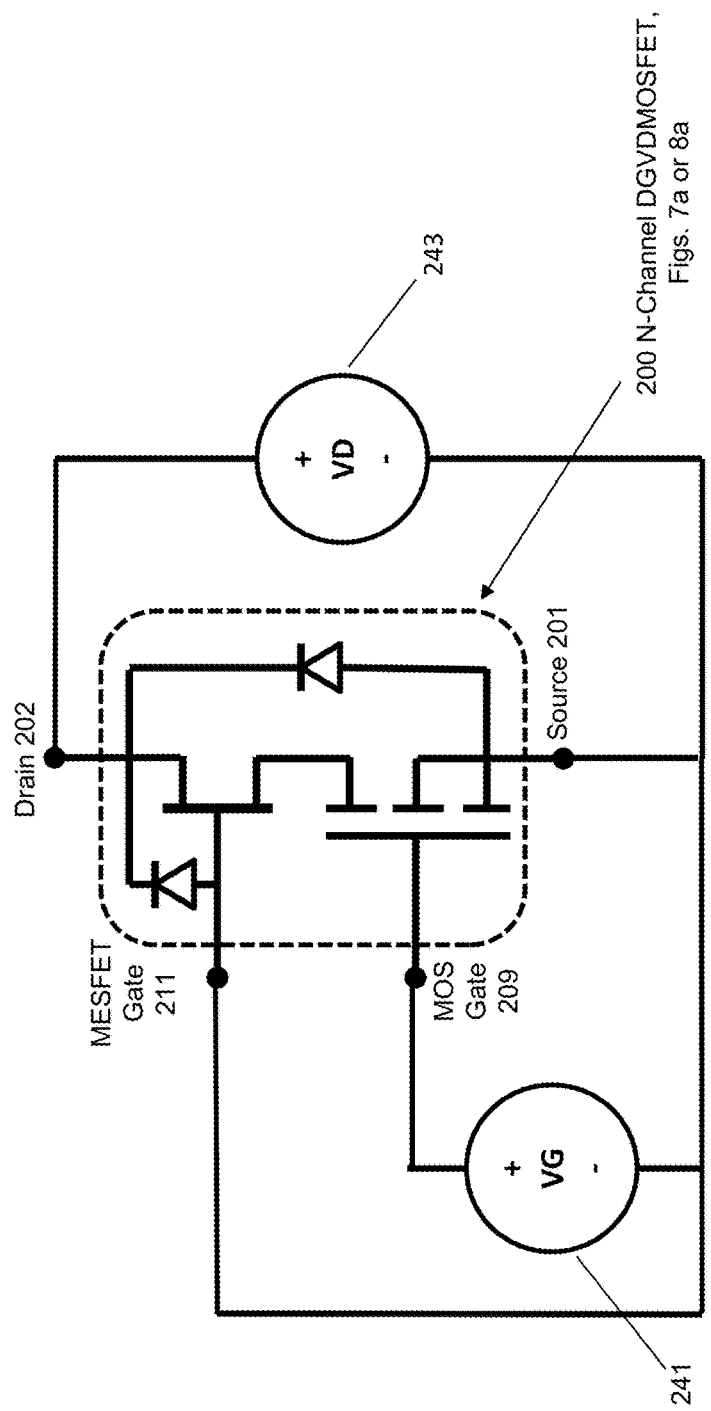
FIG. 9a shows one exemplary application (Standard DC Mode Configuration) of an exemplary DGVDMOSFET in accordance with one embodiment of the invention.
Figure 9B:
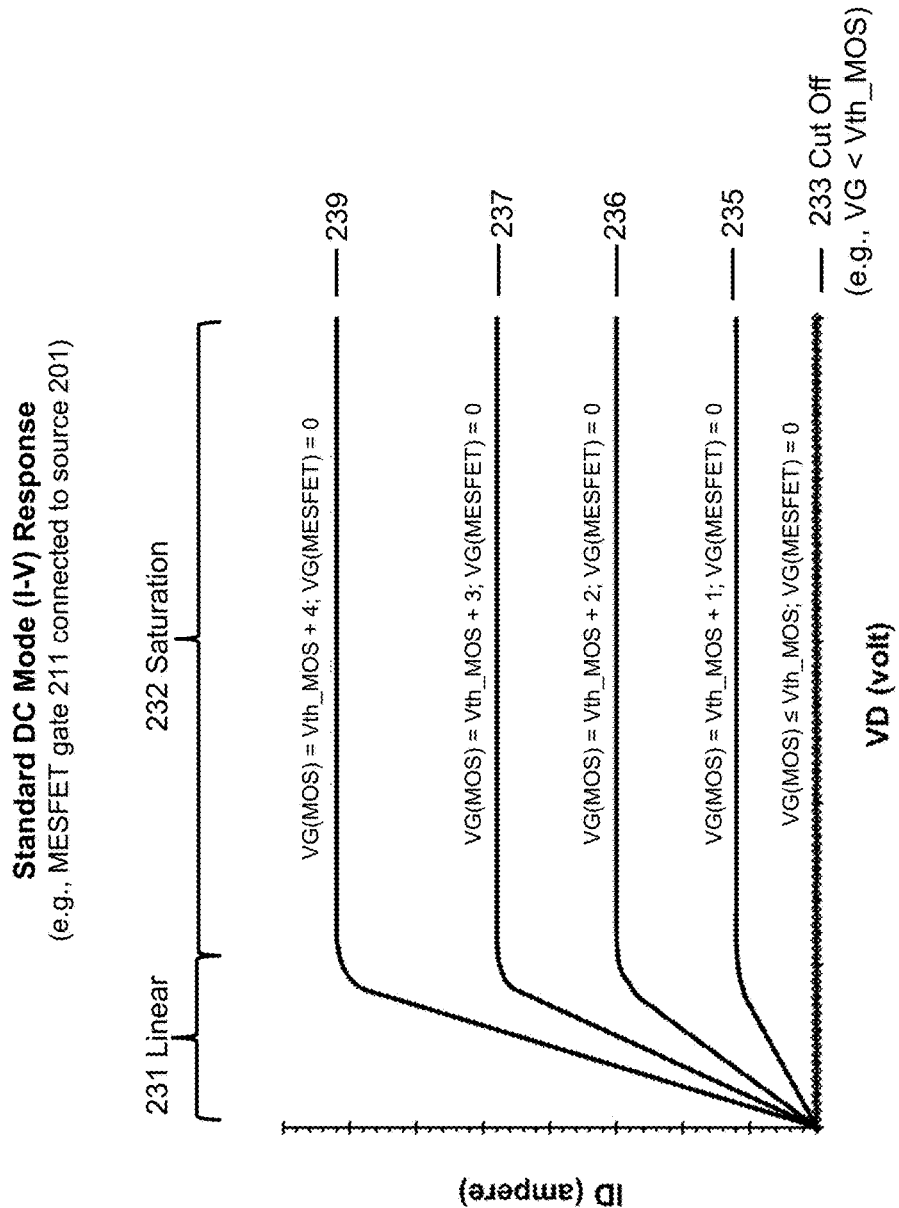
FIG. 9b shows one exemplary result or output (Standard DC Mode (I-V) response) from the FIG. 9a exemplary application in accordance with one embodiment of the invention.

FIG. 9a shows one exemplary application (Standard DC Mode Configuration) of exemplary DGVDMOSFET symbol shown in FIG. 8c in accordance with one embodiment of the invention. FIG. 9a schematic shows an external gate circuit (e.g., power supply (VG 241)) and an external drain circuit (e.g., power supply (VD 243)) coupled to DGVDMOSFET embodiment 200. Referring back to FIGS. 7a/8a in view of FIGS. 9a/9b, if MESFET gate contact 211 is connected directly to the source contact 201, one embodiment of the DGVDMOSFET 200 can be configured to function similar to a standard VDMOSFET providing similar electrical characteristics and performance of standard VDMOSFET; however, an exemplary embodiment DGVDMOSFET 200 may exhibit higher on-resistance and lower power density. FIG. 9b shows an example of five exemplary standard DC mode I-V responses or outputs (I-V responses 233, 235, 236, 237 and 239) of FIG. 9a exemplary application (Standard DC Mode configuration) in accordance with one embodiment of the invention. FIG. 9b also presents three regions of exemplary operation (cut-off 233, linear 231, and saturation 232). Cut-off 233 can be operable in FIG. 9a exemplary application if power supply VG 241 delivers a voltage less than MOS's gate threshold voltage (Vth_MOS) to effect a reduction or elimination of DGVDMOSFET's current flow through MOS's semi-conductive channel region 123. Linear 231 can be operable in FIG. 9a exemplary application if power supply VG 241 delivers a voltage greater than MOS's gate threshold voltage (Vth_MOS) to enter a resistive DGVDMOSFET current flow through MOS's semi-conductive channel region 123, where power supply VD 243 delivers a voltage less than the difference of VG 241 and Vth_MOS. Saturation 232 can be operable in FIG. 9a exemplary application if power supply VG 241 delivers a voltage greater than MOS's gate threshold voltage (Vth_MOS) to enter saturated DGVDMOSFET current flow (saturation) through MOS's semi-conductive channel region 123, where power supply VD 243 delivers a voltage greater than the difference of VG 241 and Vth_MOS. FIG. 9b does not necessarily represent an actual DGVDMOSFET's I-V response but is only provided to show how one embodiment of an exemplary DGVDMOSFET would operate in a standard DC mode configuration. Operation of an exemplary DGVDMOSFET in a standard DC mode configuration may not enhance TID performance but may provide higher SEB and SEGR performance.

Figure 10A:
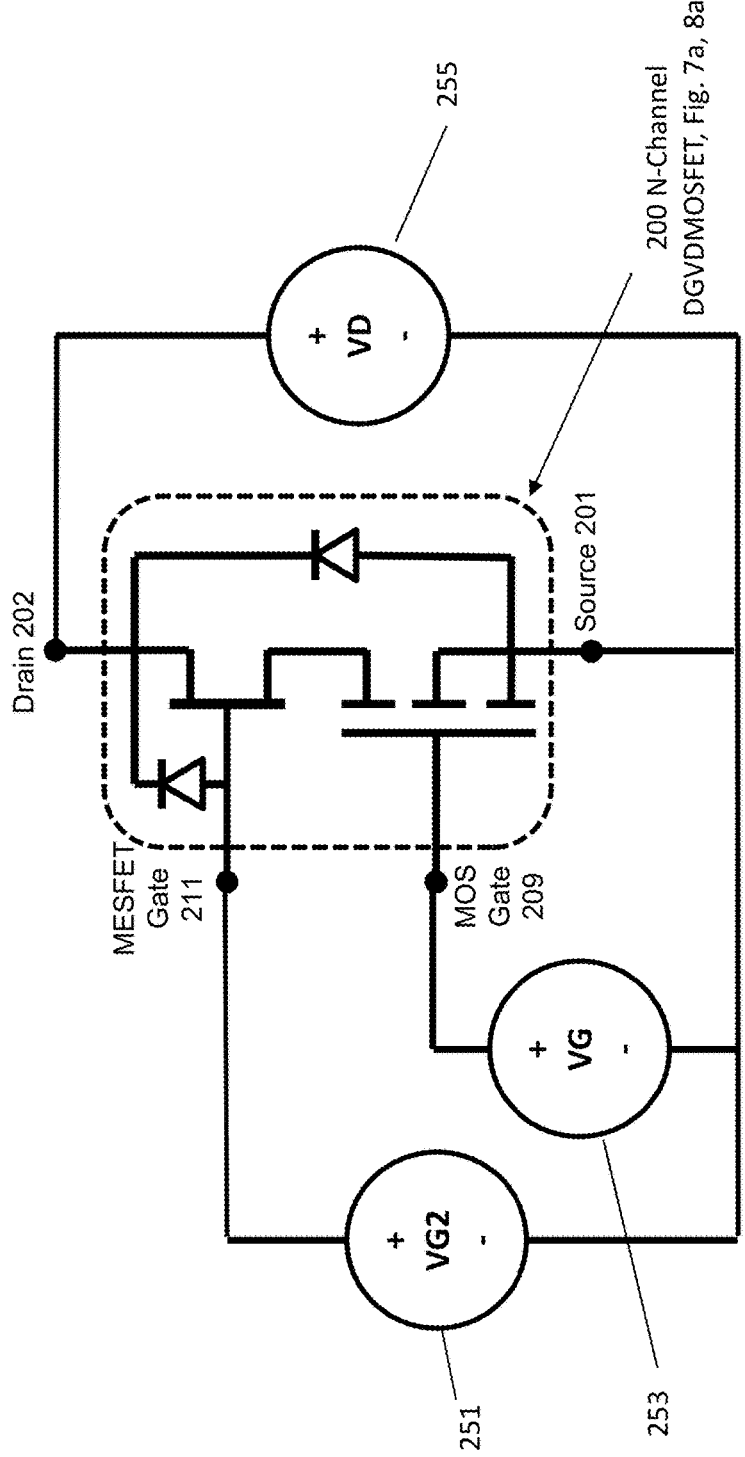
FIG. 10a shows another exemplary application (Enhanced DC Mode Configuration) of an exemplary DGVDMOSFET in accordance with one embodiment of the invention.
Figure 10B:
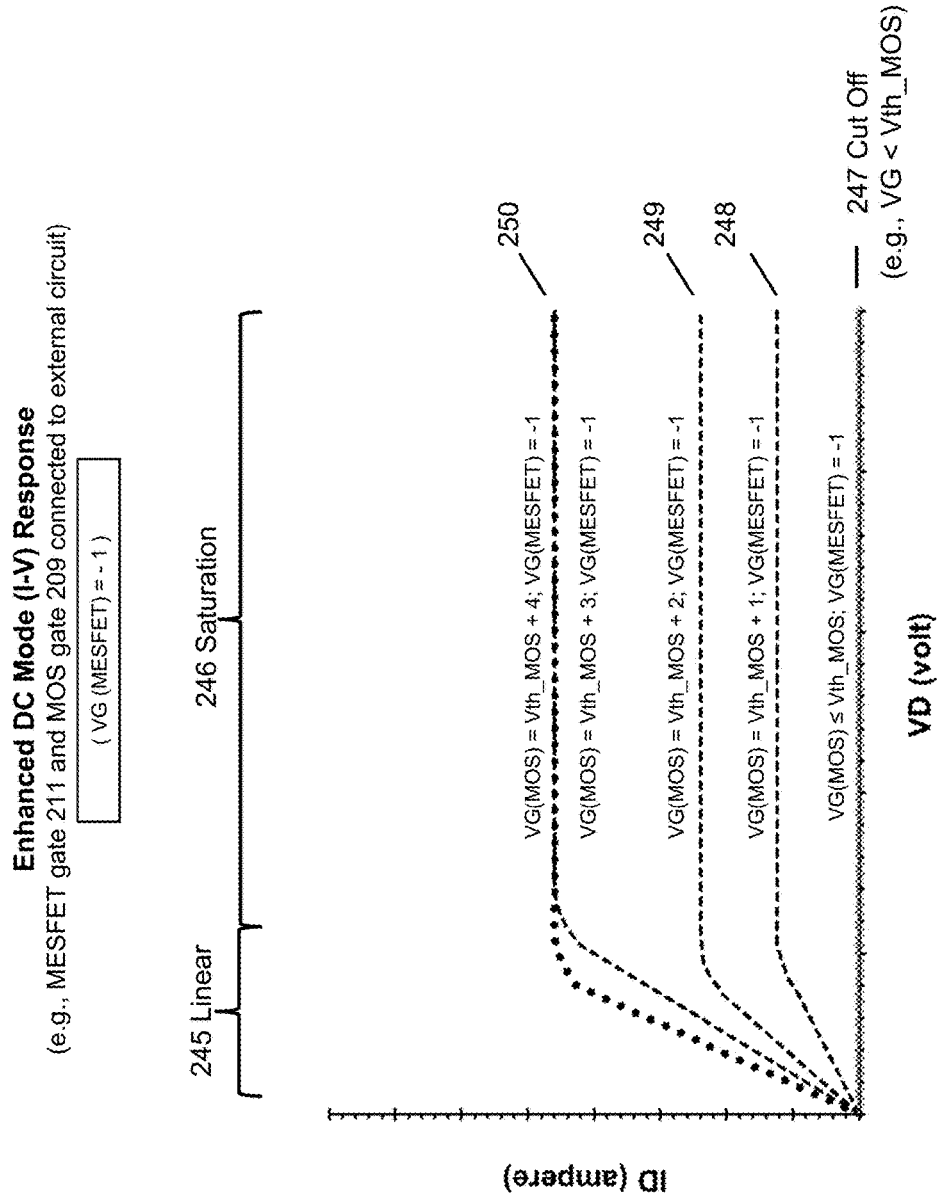
FIG. 10b shows one exemplary result or output (enhanced DC mode (I-V) response) associated with the FIG. 10a exemplary Enhanced DC Mode configuration associated with one element (e.g., MOS Gate 209 Control) of the exemplary FIG. 10a DGVDMOSFET exemplary application.
Figure 10C:
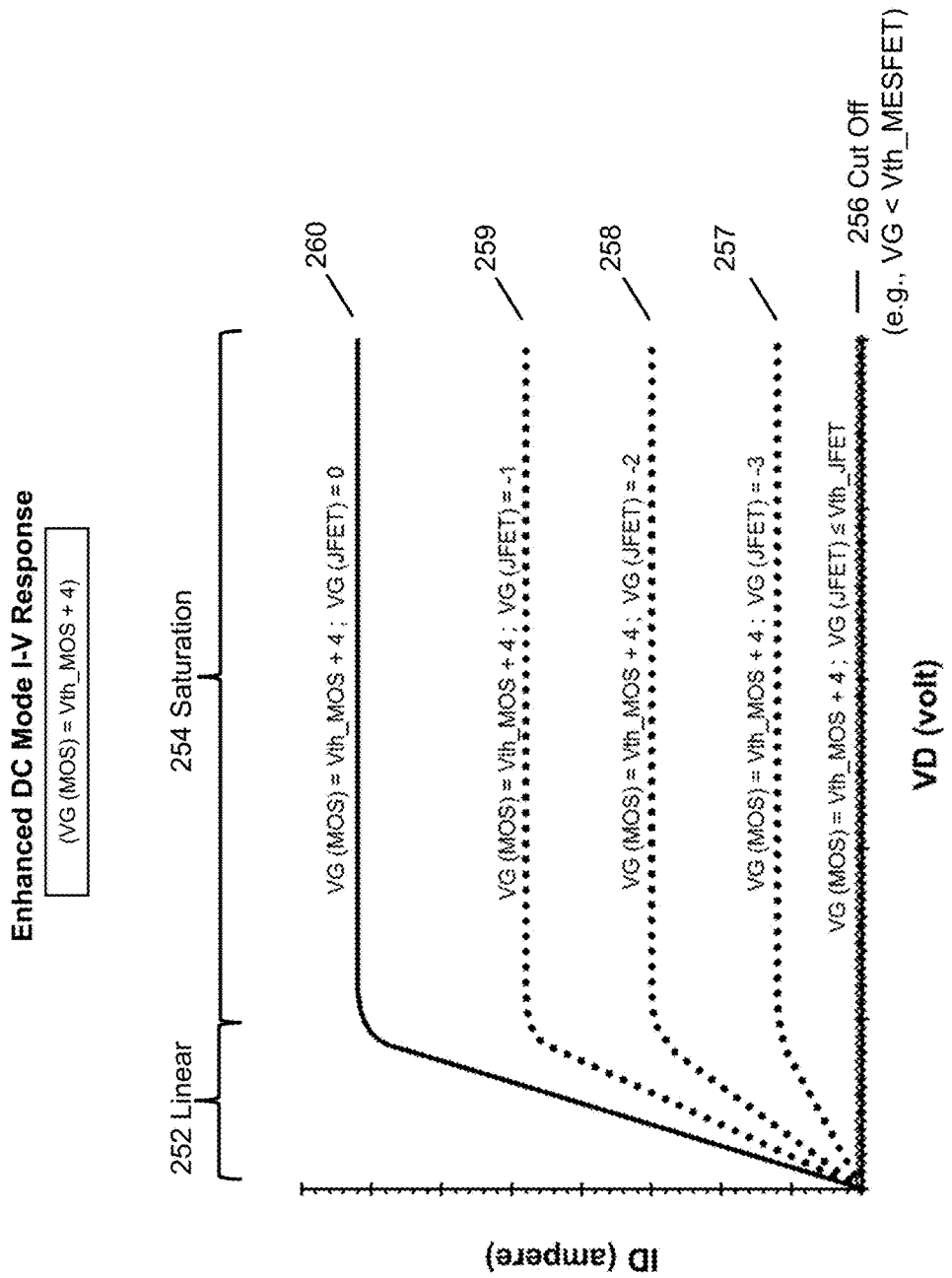
FIG. 10c shows one exemplary result or output (enhanced DC mode (I-V) response) associated with the FIG. 10a exemplary Enhanced DC Mode configuration associated with another element (e.g., MESFET 195 Control) of the exemplary FIG. 10a DGVDMOSFET exemplary application.

FIG. 10a shows another exemplary application (Enhanced DC mode configuration) of exemplary DGVDMOSFET 200 symbol shown in FIG. 8c in accordance with one embodiment of the invention. FIG. 10a schematic shows a MOS gate power supply (VG 253), a MESFET gate power supply (VG2 251), and a drain power supply (VD 255) coupled to the DGVDMOSFET embodiment 200. In this exemplary configuration, the MOSFET gate 191,193 and the MESFET gate 195 can be used separately or together to assist in controlling DGVDMOSFET's current flow. The exemplary DGVDMOSFET 200 can be configured to function similar to a standard VDMOSFET (e.g., VG2 251 voltage can be set to zero or other fixed voltage) providing similar electrical and performance of a standard VDMOSFET; can be configured to function similar to a standard MESFET (e.g., VG 253 voltage can be greater than the MOS's threshold voltage) providing similar electrical and performance of a standard MESFET; or can be configured to function similar to MESFET connected in series to VDMOSFET (e.g., VG 253 and VG2 251 voltages can be used to control current flow) providing similar electrical and performance of a series connection. The exemplary embodiment DGVDMOSFET 200 may exhibit higher on-resistance and lower power density compared to either a standard VDMOSFET or MESFET but the exemplary DGVDMOSFET's die area is comparable to either a standard VDMOSFET's or MESFET's die area (e.g., of comparable voltage and current capabilities). In this exemplary configuration, the exemplary DGVDMOSFET 200 offers enhanced operational and performance capabilities with respect to TID, SEB, and SEGR. Enhanced TID performance can occur because the exemplary MESFET gate 195 can continue to function even after high levels of TID exposure (e.g., TID>1 Mrd) and can be used to control current flow through the DGVDMOSFET's semi-conducting channel region 125 even after MOSFET 191,193 sections become non-functional due to TID-induced voltage shift of MOS's threshold voltage. Enhanced SEGR performance can occur because the exemplary MESFET gate 195 can be used to produce an electrical field 194 as shown in FIG. 8a/FIG. 8b (e.g., depletion layer), where an electrical field 194 provides an additional barrier to retard drain potentials from coupling to the exemplary MOSFET gate oxide 208 during heavy ion strikes. Additional enhanced SEGR performance can occur because MOSFET 191,193 sections can be configured to conduct current (e.g., FIG. 10c, linear 251 or saturation 254) and MESFET gate 195 can be configured to block current (e.g., FIG. 10c, cut-off 256), where under this exemplary configuration coupling of drain voltage to the gate oxide 208 is minimized. Enhanced SEB performance can occur because the exemplary MESFET gate 195 can be used to produce an electrical field 194 (e.g., formation of a depletion field), where formation of electrical field 194 collects a portion of heavy ion generated photocurrent to effect a reduction in heavy ion generated photocurrent collected through the MOSFET 191, 193. Additional enhanced SEB performance can occur because MOSFET 191, 193 can be configured to conduct current (e.g., FIG. 10c, linear 251 or saturation 254) and MESFET gate 195 can be configured to block current (e.g., FIG. 10c, cut-off 256), where under this exemplary configuration a portion of the heavy ion generated photocurrent can be collected directly through the source 207 reducing heavy ion generated photocurrent collected through the body 205. FIG. 10a represents an exemplary DGVDMOSFET schematically connected to operate in an enhanced DC mode configuration. FIG. 10b represents an exemplary current-voltage (I-V) response of an exemplary DGVDMOSFET 200 when exemplary MESFET gate 195 is at a fixed bias and the MOSFET 191, 193 sections modulate current flow. FIG. 10b demonstrates an example of five exemplary enhanced DC mode I-V responses or outputs (I-V responses 247, 248, 249, and 250) of FIG. 10a exemplary application (enhance DC mode configuration) in accordance with one embodiment of the invention. FIG. 10b also depicts three regions of exemplary operation (cut-off 247, linear 245, and saturation 246). Cut-off 247 can be operable in FIG. 10a exemplary example if power supply VG 253 delivers a voltage less than MOS's gate threshold voltage (Vth_MOS) to effect a reduction or elimination of DGVDMOSFET's current flow through MOS's semi-conductive channel region 123. Linear 245 can be operable in FIG. 10a exemplary example if power supply VG 253 delivers a voltage greater than MOS's gate threshold voltage (Vth_MOS) to enter a resistive DGVDMOSFET current flow through MOS's semi-conductive channel region 123, where power supply VD 255 delivers a voltage less than the difference of VG and Vth_MOS. Saturation 246 can be operable in FIG. 10a exemplary example if power supply VG 253 delivers a voltage greater than MOS's gate threshold voltage (Vth_MOS) to enter limited DGVDMOSFET current flow (saturation) through MOS's semi-conductive channel region 123, where power supply VD 255 delivers a voltage greater than the difference of VG and Vth_MOS. FIG. 10c represents a current-voltage (I-V) characteristic of an exemplary DGVDMOSFET 200 when exemplary MOSFET 191, 193 is at a fixed bias and the MESFET gate 195 modulates current flow. FIG. 10c shows examples of exemplary responses or outputs (I-V responses 256, 257, 258, 259 and 260) of enhanced DC Mode operation from FIG. 10a exemplary application in accordance with one embodiment of the invention. FIG. 10c also depicts exemplary examples of three regions of exemplary operation, cut-off 256, Linear 252, and saturation 254. Cut-off 252 can be operable in FIG. 10a exemplary example when power supply VG2 251 delivers a voltage less than MESFET's gate threshold voltage (Vth_MESFET) to effect a reduction or elimination of DGVDMOSFET's current flow through MESFET's semi-conductive channel region 125. Linear 252 can be operable in FIG. 10a exemplary example when power supply VG2 251 delivers a voltage greater than MESFET's gate threshold voltage (Vth_MESFET) to enter a resistive DGVDMOSFET current flow through MESFET's semi-conductive channel region 125, where power supply VD 255 delivers a voltage less than the difference of VG and Vth_MESFET. Saturation 254 can be operable in FIG. 10a exemplary example when power supply VG2 251 delivers a voltage greater than MESFET's gate threshold voltage (Vth_MESFET) to enter limited DGVDMOSFET current flow (saturation) through MESFET's semi-conductive channel region 125, where power supply VD 255 delivers a voltage greater than the difference of VG and Vth_MESFET. FIGS. 10b and 10c do not represent actual DGVDMOSFET's I-V characteristics and are only provided to demonstrate application of an exemplary DGVDMOSFET in enhanced DC mode.

Figure 11A:
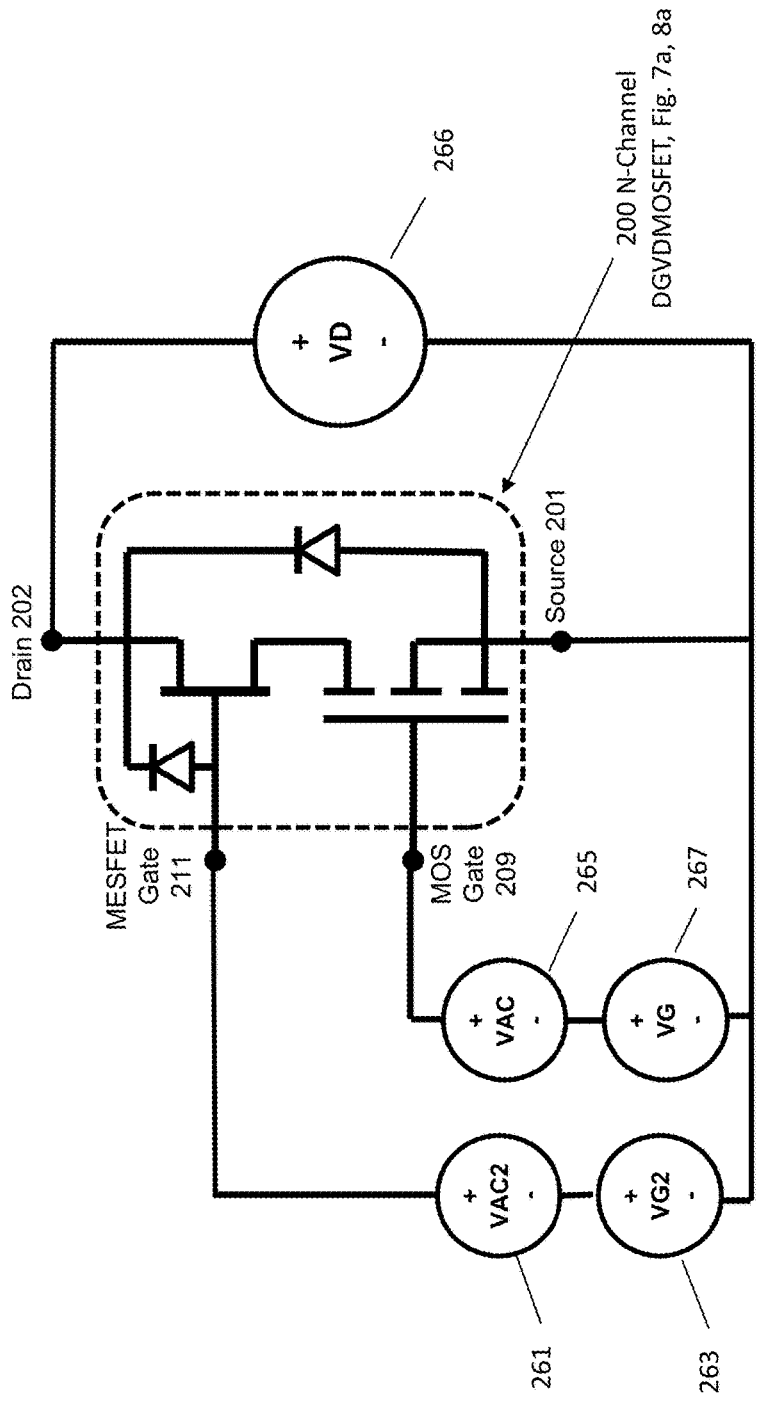
FIG. 11a shows another exemplary application (Dual gate AC Mode Configuration) of an exemplary DGVDMOSFET in accordance with one embodiment of the invention.
Figure 11B:
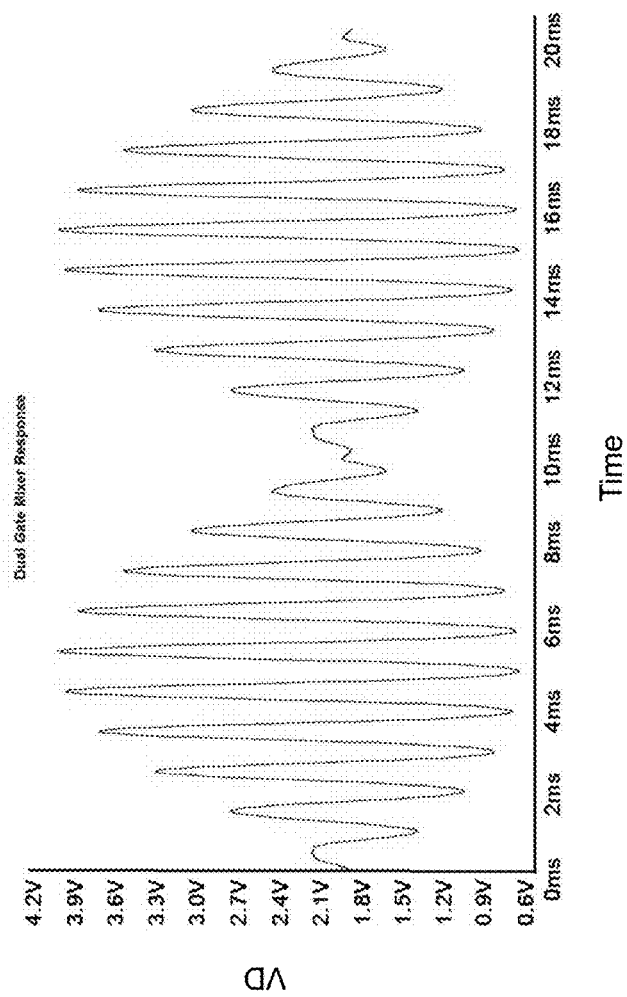
FIG. 11b shows one exemplary result or output (dual gate AC mode response e.g., a simplistic mixer output) from the FIG. 11a exemplary application.

FIG. 11a shows another exemplary application (e.g., enhanced AC mode configuration) of exemplary DGVDMOSFET 200 symbol shown in FIG. 8c in accordance with one embodiment of the invention. FIG. 11a schematic shows a MOS gate power supply (VG) 267, a MOS gate alternating current (AC) power supply (VAC) 265, a MESFET gate power supply (VG2) 263, a MESFET gate AC power supply (VAC2) 261, and a drain power supply (VD) 266 coupled to the DGVDMOSFET embodiment 200. In this exemplary configuration, the MOSFET gate 191,193 and the MESFET gate 195 can be operated separately or together to assist in controlling DC current flow and AC current flow in phase or out of phase to allow a variety of different radio frequency (RF) type applications such as RF mixers, RF amplifiers, and RF gain control. This exemplary operational mode provides application designers functionality of two independent gates in a variety of RF type applications. The FIG. 11a exemplary embodiment represents a simplistic RF mixer application using exemplary DGVDMOSFET 200 in a dual-gate AC mode operation. FIG. 11b represents one exemplary output using a RF mixer type circuit. FIG. 11b does not represent an actual DGVDMOSFET output but is provided to demonstrate its potential application.

Exemplary embodiments of a DGVDMOSFET (e.g., 200, 200') can provide for a design/layout of a monolithic structure with two independent gate terminals to modulate drain-to-source current flow (e.g., can replace two devices, where devices are slaved together). With two independent gate terminals to modulate current flow (or modulate signal), an exemplary embodiment can be used as a radio frequency (RF) mixer, modulator, demodulator, gain control element and more in analog circuits. Exemplary gate functionality can be operated out of phase or operated in phase depending upon the desired circuit application allowing greater circuit design flexibility in this example due to how two-gate functionality in accordance with an embodiment of the invention can be independent in operation. A monolithic solution lowers costs, size, and weight and increase reliability which are important factors in a majority of strategic and space systems.

In one example, conventional non-radiation hardened VDMOSFETs cannot operate in TID environments without degraded performance of the MOSFET sections 191, 193 where a MOS gate may become non-functional (non-functional performance of commercial VDMOSFETs with ionizing radiation can be less than 10 krd(Si)). An addition of an exemplary MESFET gate 195 provides a different configuration and method to control current flow. An exemplary MESFET gate 195 is not directly degraded by TID radiation (e.g., functional performance of MESFETs with ionizing radiation can be greater than 1 Mrd(Si)). If MOSFET sections 191, 193 are degraded or become non-functional due to TID, then an exemplary MESFET gate 195 can be used to extend the operating performance of device.

An exemplary embodiment can be designed and fabricated to operate at drain-to-source voltages from a few volts to voltages over a thousand volts. A drain-to-source breakdown voltage (BVDSS) of an exemplary embodiment can be determined by epitaxial doping and epitaxial thickness. An exemplary design and layout of an overall embodiment can be minimal. Therefore, exemplary embodiments with different blocking voltages can be realized.

An exemplary embodiment can be designed and fabricated to handle different currents. The current handling capability of a fabricated device can be increased by placing an exemplary embodiment into an array of parallel cells that can be a few cells to several thousand cells placed in parallel. Therefore, embodiments with different current capabilities can be realized.

An exemplary MESFET gate 195 can maintain operational capability in particle-rich radiation environment such as a space environment. For example, an exemplary MESFET gate 195 can increase failure threshold voltages for SEB and SEGR, which increases the operational capabilities of exemplary embodiments in a particular type of radiation environment (higher failure thresholds equate to higher radiation performance). Higher SEB and SEGR failure threshold voltages are desirable in short- and long-term applications where embodiments of the invention are subjected to particles (SEB and SEGR can be catastrophic).

SEB performance can be improved with an exemplary embodiment as particle-induced photocurrent, which normally flows into Body 205 or 214 can decrease as a portion of induced photocurrent can flow into the exemplary MESFET 195's section. Reducing induced photocurrent flowing into exemplary Body 205 can increase a threshold for SEB.

SEGR performance can be improved using an embodiment of the invention because particle-induced coupling of a portion of the drain potential across an exemplary gate oxide 208 can be impeded by an added depletion field induced by an exemplary MESFET section 195.

An exemplary embodiment can provide for two independent body diodes (e.g., a source body diode and a MESFET body diode). Having two independent diodes allows more flexibility in circuit designs. As an example, a source body diode or MESFET body diode can be used as a freewheeling diode in switching applications.

An exemplary embodiment can be fabricated using different semiconductor and dielectric materials e.g., Silicon (Si) and Silicon Dioxide (SiO2). Other semiconductor materials such as silicon carbide (SiC) and Gallium Arsenide (GaAs) can be used instead of silicon for, e.g., an epitaxial layer and doped implants/diffusions. Use of other semiconductor materials such as SiC provides structures with different characteristics and higher performance characteristics. As an example, SiC has a higher band gap, breakdown field, and thermal conductivity when compared to silicon. These types of characteristics yield higher current density, higher voltages, and better thermal conductivity. Other dielectric materials can be used to form, e.g., gate oxide 208. Alternative materials can include but are not limited to SiN, $Al_2O_3$, and HfO2. Use of other dielectrics provides different performance characteristics such as increasing or decreasing oxide capacitance which affects switching performance.

Figure 12:
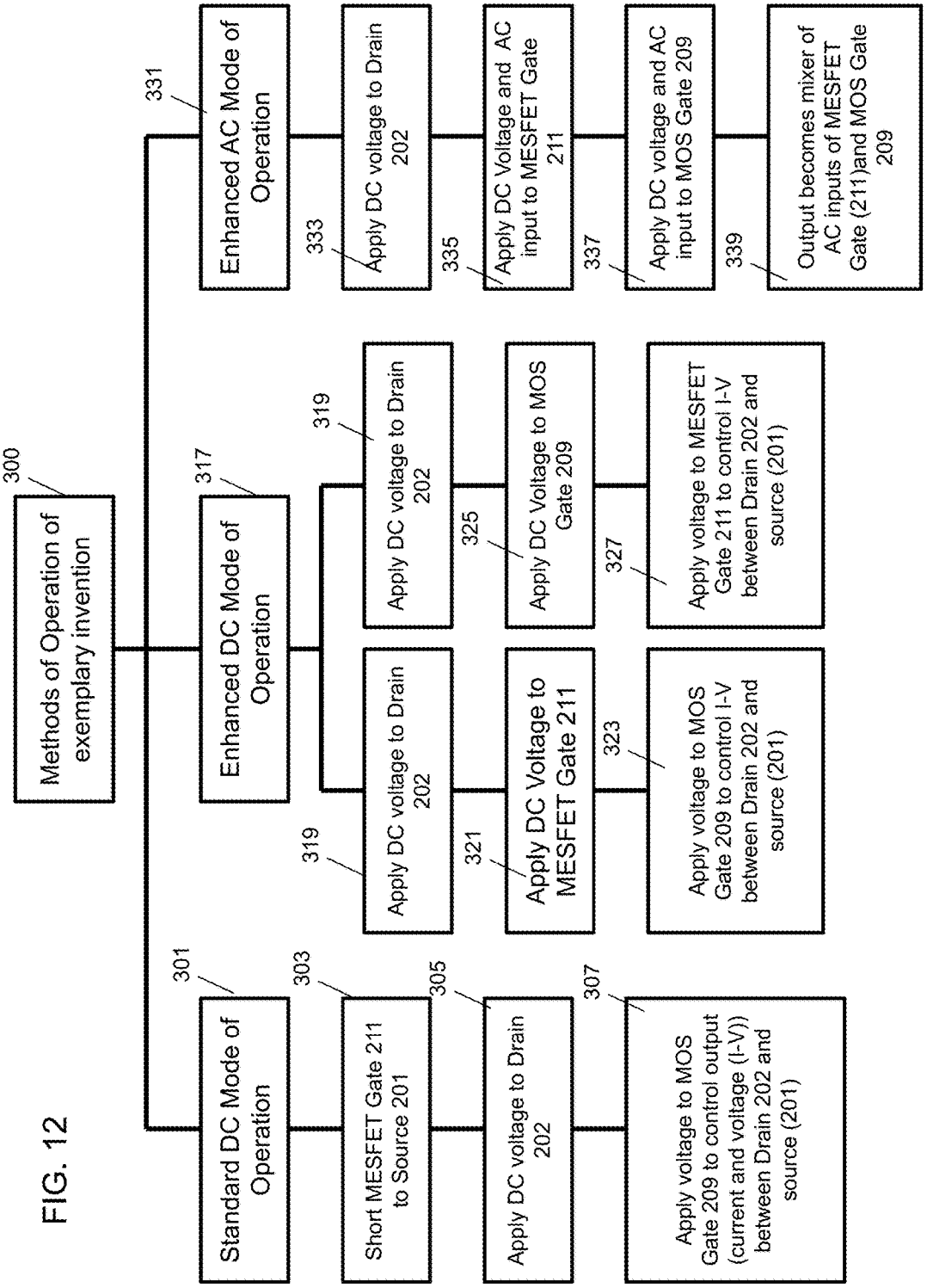
FIG. 12 shows exemplary methods of operation of exemplary embodiments of the invention comprising various modes of operation.

FIG. 12 shows exemplary methods of operation 300 of exemplary embodiments of the invention. These methods of operation can be triggered based on determinations that operation of one or more functionalities of an exemplary embodiment of the invention is needed such as, for example, detecting a condition to alter operation of the MOSFET sections 191, 193 in response to an electromagnetic interference event. Another determination for need to operate exemplary functionality is determining additional or different current or voltage control operations are desirable such as in RF system operation such as described above. Once a determination of a need for operation has been determined, operation of an exemplary embodiment of the invention can commence such as, for example, at step 301, a standard DC mode of operation can be initiated comprising providing an exemplary embodiment of the invention such as described above; at step 303, shorting MESFET Gate 211 to Source 201; at step 305, applying DC voltage to drain 202; at step 307, applying voltage to MOS Gate 209 to control output, current and voltage, between drain 202 and source 201. A second mode can comprise initiating an Enhanced DC Mode of Operation using a design such as described herein/above at step 317; at step 319, apply DC voltage to drain 202; steps 321/325 can be executed concurrently or separately following a step shown as respectively preceding these steps comprising applying DC voltage to MESFET gate 211 and applying DC voltage to MOS gate 209; steps 323 and 327 can be executed concurrently or separately comprising applying voltage to MOS gate 209 to control current/voltage between drain 202 and source 201 as well as applying voltage to MESFET gate 211 to control current/voltage between drain 202 and source 201. At step 331, exemplary processing provides an Enhanced AC Mode configuration in accordance with an exemplary embodiment of the invention, such as discussed above/herein and initiates an Enhanced AC Mode Operation at step 331; at Step 333, applying DC voltage to drain 202; at step 335, applying DC voltage and AC input to MESFET Gate 211; at step 337, applying DC voltage and AC input to MOS gate 209; and at Step 339, producing output using said Enhanced AC Mode Configuration of a mixer of AC inputs of MESFET Gate 211 and MOS Gate 209.

Figure 13:
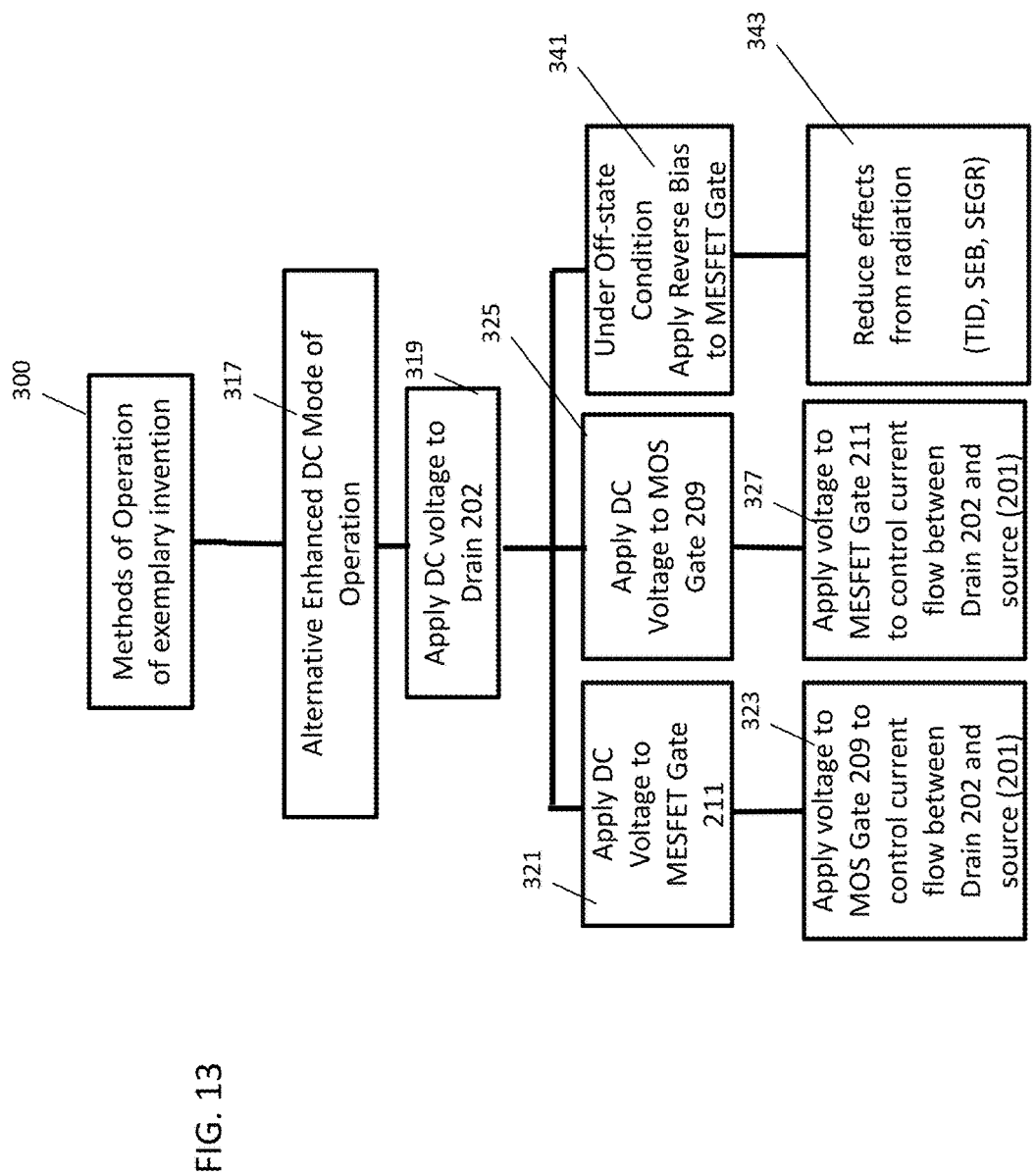
FIG. 13 shows another exemplary method of operation of an exemplary embodiment of the invention comprising another mode of operation.

FIG. 13 shows another exemplary method of operation in accordance with another embodiment of the invention. Again, processing begins with providing an embodiment and configuration of an exemplary embodiment of the invention such as, for example, an Alternative Enhanced DC Mode of Operation Configuration, such as discussed herein/ above at step 317; at step 319, applying DC voltage to drain 202; steps 321, 325, and 341 (each following step 319) can be executed substantially concurrently or separately following a step shown as preceding these steps wherein step 321 comprises applying DC voltage to MESFET Gate 211, applying DC voltage to MOS Gate 209, and under an "Off State" condition (e.g., when MOS Gate is turned off or not having power applied to one or more portions of it), apply reverse bias to the MESFET Gate 211; steps 323, 327, and 343 (respectively following step 321, 325, and 341) can be executed substantially concurrently or separately following a step shown as preceding these steps wherein step 323 comprises applying voltage to MOS Gate 209 to control current flow between drain 202 and source 201, step 327 comprises applying voltage to MESFET Gate 211 to control current flow between drain 202 and source 201, and reducing effects from radiation or electromagnetic interference at step 343 by operation or modulation of the exemplary Alterative Enhanced DC Mode configuration.

Figure 14:
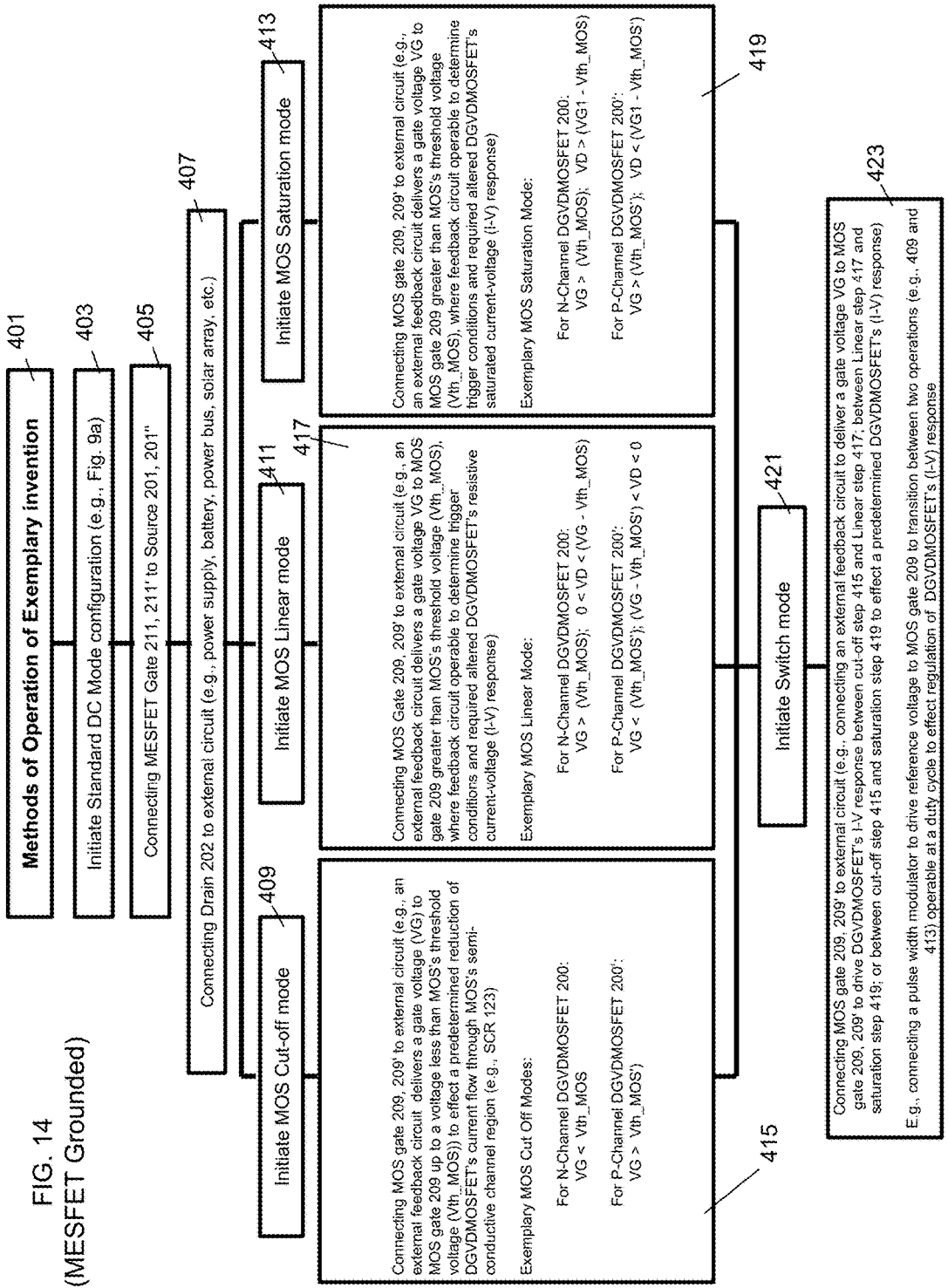
FIG. 14 shows another exemplary method of operation of an exemplary embodiment of the invention comprising another mode of operation.

FIG. 14 shows another exemplary method of operation 401 in accordance with another embodiment of the invention. Again, a process begins by initiating standard DC mode configuration step 403 by connecting the MESFET gate 211 to the source 201 step 405 and by connecting drain 202 to an external circuit (e.g., power supply) step 407. The next step is a determination depending upon system requirements of how to configure exemplary functionality such as whether to initiate MOS cut-off mode step 409; whether to initiate MOS linear mode step 411; whether to initiate MOS saturation mode step 413; or whether to initiate Switch mode step 421. MOS cut-off mode step 415 is initiated by connecting MOS gate 209 to an external circuit that delivers a gate voltage to MOS gate 209 up to a voltage less than the MOS's threshold voltage (Vth_MOS) to effect a reduction or elimination of DGVDMOSFET current flow through the semi-conductive channel region (e.g., SCR 123). MOS linear mode step 417 is initiated by connecting MOS gate 209 to an external circuit that delivers a gate voltage to MOS gate 209 that is greater than the MOS's threshold voltage (Vth_MOS) to effect and to modulate a resistive current-voltage (I-V) response through MOS's semi-conductive channel region (e.g., SCR 123). To function in linear mode step 417, drain voltages must be less than the difference between the gate voltage (VG) and the gate threshold voltage (VTH_MOS) (e.g., VD<VG–Vth_MOS). MOS saturation mode step 419 is initiated by connecting MOS gate 209 to an external circuit that delivers a gate voltage to MOS gate 209 that is greater than the MOS's threshold voltage (Vth_MOS) to effect and to modulate a resistive current-voltage (I-V) response through MOS's semi-conductive channel region (e.g., SCR 123). To function in saturation mode step 419, drain voltages must be greater than the difference between the gate voltage (VG) and the gate threshold voltage (VTH_MOS) (e.g., VD>VG–Vth_MOS). Switch mode step 423 is initiated by connecting MOS gate 209 to an external circuit to deliver a gate voltage VG to MOS gate 209 to switch the DGVDMOSFET's I-V response between cut-off step 415 and linear step 417; between linear step 417 and saturation step 419; or between cut-off step 415 and saturation step 419 to effect a predetermined DGVDMOSFET's (I-V) response operable to a duty cycle to effect said predetermined I-V response.

Figure 15:
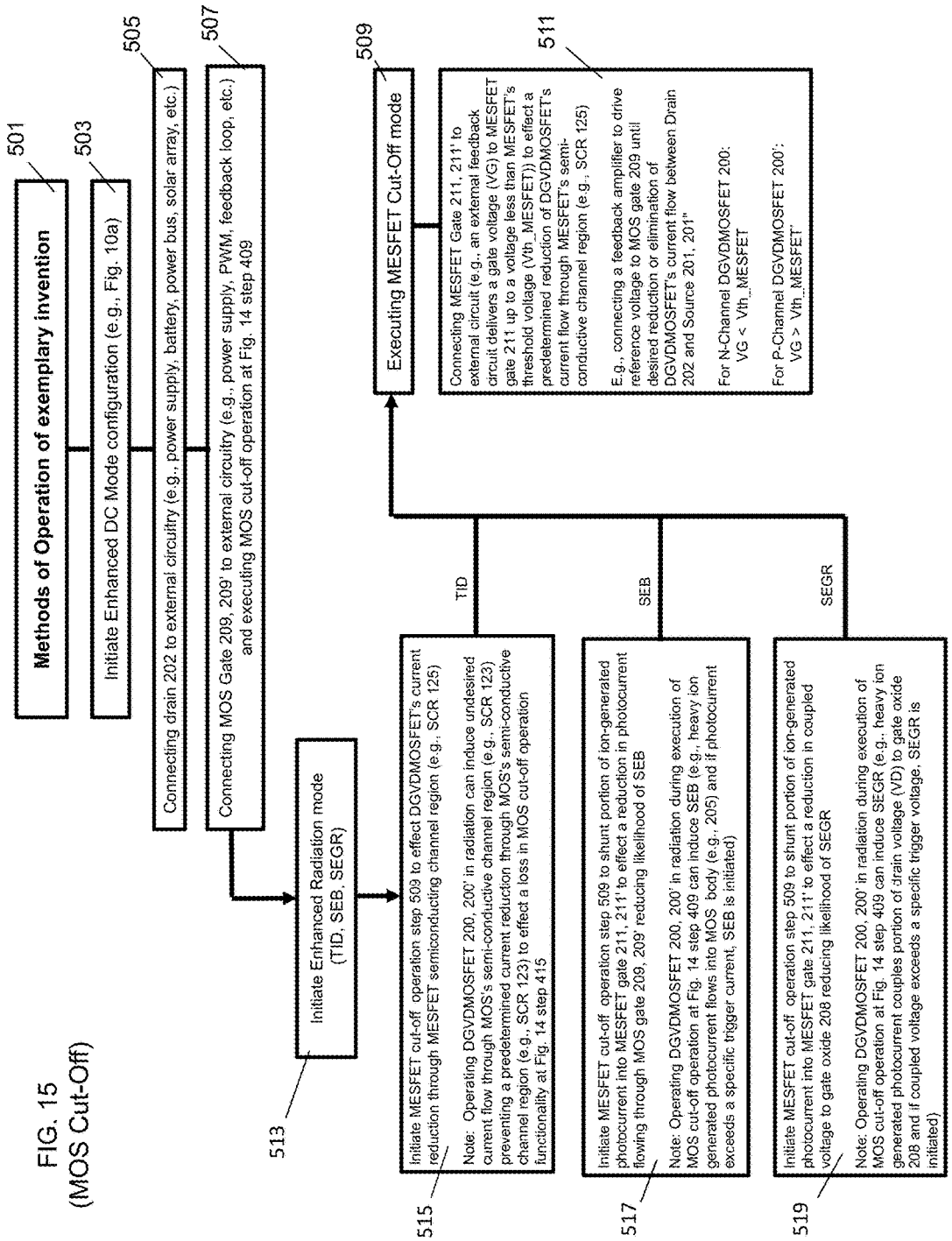
FIG. 15 shows another exemplary method of operation of an exemplary embodiment of the invention comprising another mode of operation.

FIG. 15 shows another exemplary method of operation 501 in accordance with another embodiment of the invention. Again, a process begins by initiating enhanced DC mode step 503 by connecting the MOS gate 209 to an external circuit executing cut-off mode step 507 and by connecting drain 202 to an external circuit (e.g., power supply) step 505. The process continues by initiating an enhanced radiation mode step 513 providing a configuration to enhance performance of the DGVDMOSFET functionality when the embodiment of the invention is subjected to radiation effects (e.g., TID 515, SEB 517, and SEGR 519), by executing MESFET cut off mode step 509. Cut off 511 is initiated by connecting MESFET gate 211 to an external circuit that delivers a gate voltage to MESFET gate 211 up to a voltage less than MESFET's threshold voltage (Vth_MESFET) to effect a reduction or elimination of DGVDMOSFET current flow through the semi-conductive channel region (e.g., SCR 125).

Figure 16:
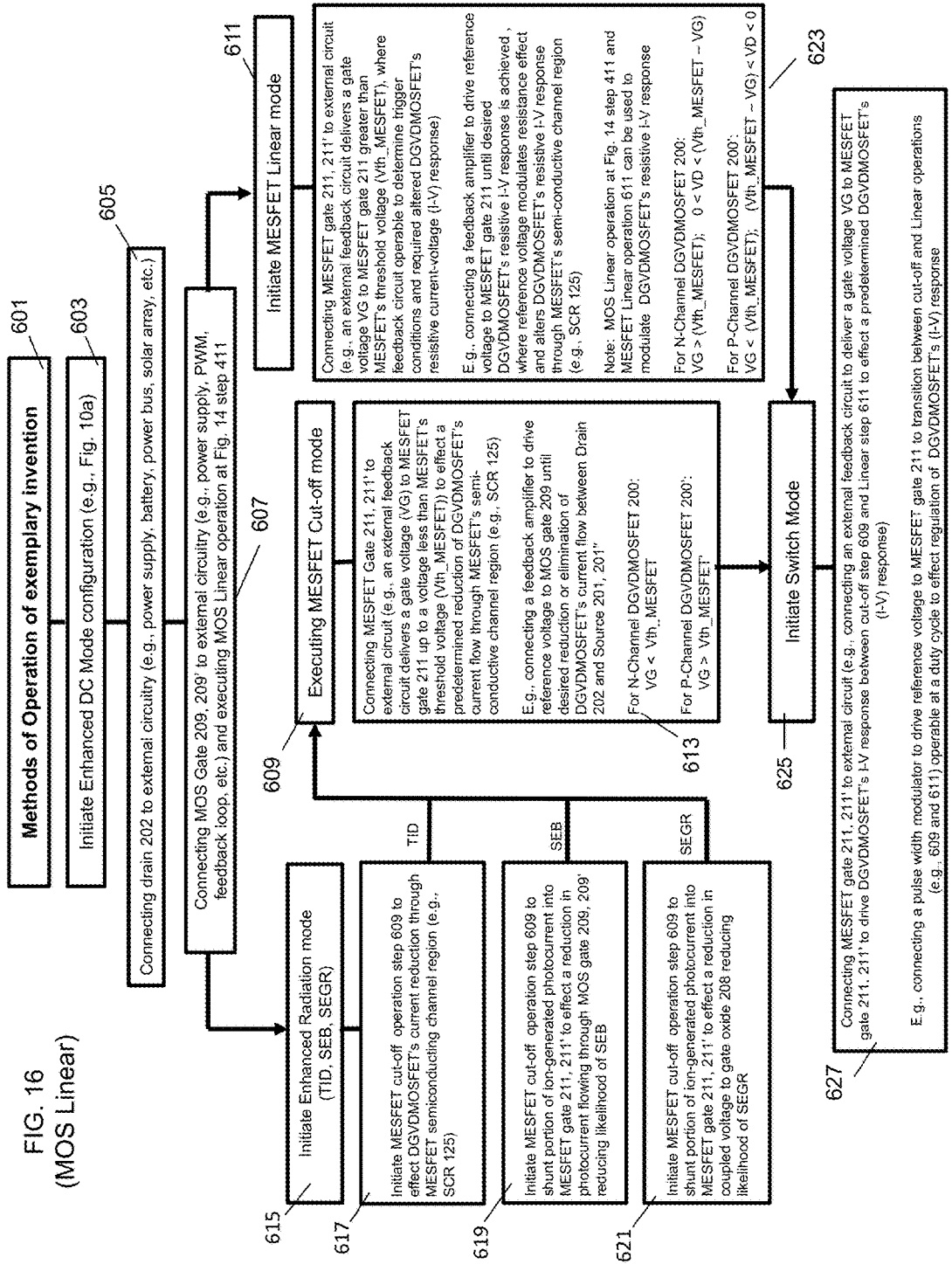
FIG. 16 shows another exemplary method of operation of an exemplary embodiment of the invention comprising another mode of operation.

FIG. 16 shows another exemplary method of operation 601 in accordance with another embodiment of the invention. Again, a process begins by initiating enhanced DC mode step 603 by connecting the MOS gate 209 to an external circuit executing linear mode step 607 and by connecting drain 202 to an external circuit (e.g., power supply) step 605. The process continues by initiating enhanced radiation mode step 615 providing a configuration to enhance performance of the DGVDMOSFET functionality when the embodiment of the invention is subjected to radiation effects (e.g., TID 617, SEB 619, and SEGR 621), by executing MESFET cut off mode step 609. Other processes can be employed by initiating MESFET linear mode step 611; or by initiating switch mode step 625. Cut off step 613 is initiated by connecting MESFET gate 211 to an external circuit that delivers a gate voltage to MESFET gate 211 up to a voltage less than the MESFET's threshold voltage (Vth_MESFET) to effect a reduction or elimination of DGVDMOSFET current flow through MESFET's semi-conductive channel region (e.g., SCR 125). Linear mode step 623 is initiated by connecting MESFET gate 211 to an external circuit that delivers a gate voltage to MESFET gate 211 that is greater than MESFET's threshold voltage (Vth_MESFET) to effect and to modulate a resistive current-voltage (I-V) response through MESFET's semi-conductive channel region (e.g., SCR 125). To function in linear mode step 623, drain voltages must be less than the difference between the gate voltage (VG) and the gate threshold voltage (VTH_MESFET) (e.g., VD<VG–Vth_MESFET). The process can evolve by initiating switch mode step 625. Switch mode step 627 is initiated by connecting MESFET gate 211 to an external circuit to deliver a gate voltage VG to MESFET gate 211 to switch DGVDMOSFET's I-V response between cut-off step 613 and linear step 623 to produce a predetermined DGVDMOSFET's (I-V) response operable to a duty cycle to effect said predetermined I-V response.

Figure 17:
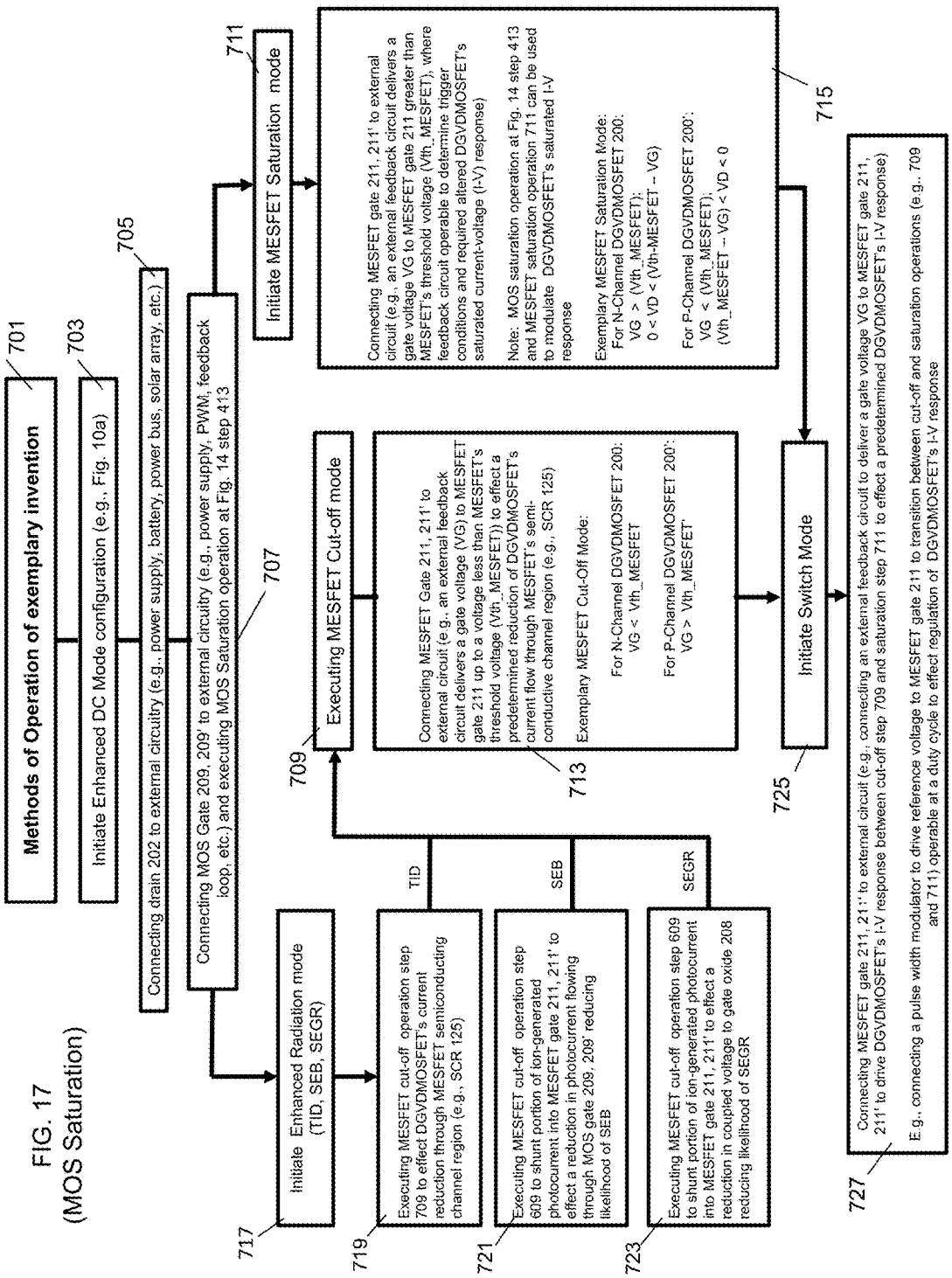
FIG. 17 shows another exemplary method of operation of an exemplary embodiment of the invention comprising another mode of operation.

FIG. 17 shows another exemplary method of operation 701 in accordance with another embodiment of the invention. Again, a process begins by initiating enhanced DC mode step 703 by connecting the MOS gate 209 to an external circuit executing saturation mode step 707 and by connecting drain 202 to an external circuit (e.g., power supply) step 705. The process continues by initiating enhanced radiation mode step 717 providing a configuration to enhance performance of the DGVDMOSFET functionality when the embodiment of the invention is subjected to radiation effects (e.g., TID 719, SEB 721, and SEGR 723), by executing MESFET cut off mode step 709. Other processes can be employed by initiating MESFET saturation mode step 711; or by initiating switch mode step 725. Cut off step 713 is initiated by connecting MESFET gate 211 to an external circuit that delivers a gate voltage to MESFET gate 211 up to a voltage less than the MESFET's threshold voltage (Vth_MESFET) to effect a reduction or elimination of DGVDMOSFET current flow through MESFET's semi-conductive channel region (e.g., SCR 125). Saturation mode step 715 is initiated by connecting MESFET gate 211 to an external circuit that delivers a gate voltage to MESFET gate 211 that is greater than MESFET's threshold voltage (Vth_MESFET) to effect and to modulate a saturated current-voltage (I-V) response through MESFET's semi-conductive channel region (e.g., SCR 125). To function in saturation mode step 715, drain voltages must be greater than the difference between the gate voltage (VG) and the gate threshold voltage (VTH_MESFET) (e.g., VD>VG−Vth_MESFET). Another process can evolve by initiating switch mode step 725. Switch mode step 727 is initiated by connecting MESFET gate 211 to an external circuit to deliver a gate voltage VG to MESFET gate 211 to switch DGVDMOSFET's I-V response between cut-off step 613 and saturation step 715 to produce a predetermined DGVDMOSFET's (I-V) response operable to a duty cycle to effect said predetermined I-V response.

Figure 18:
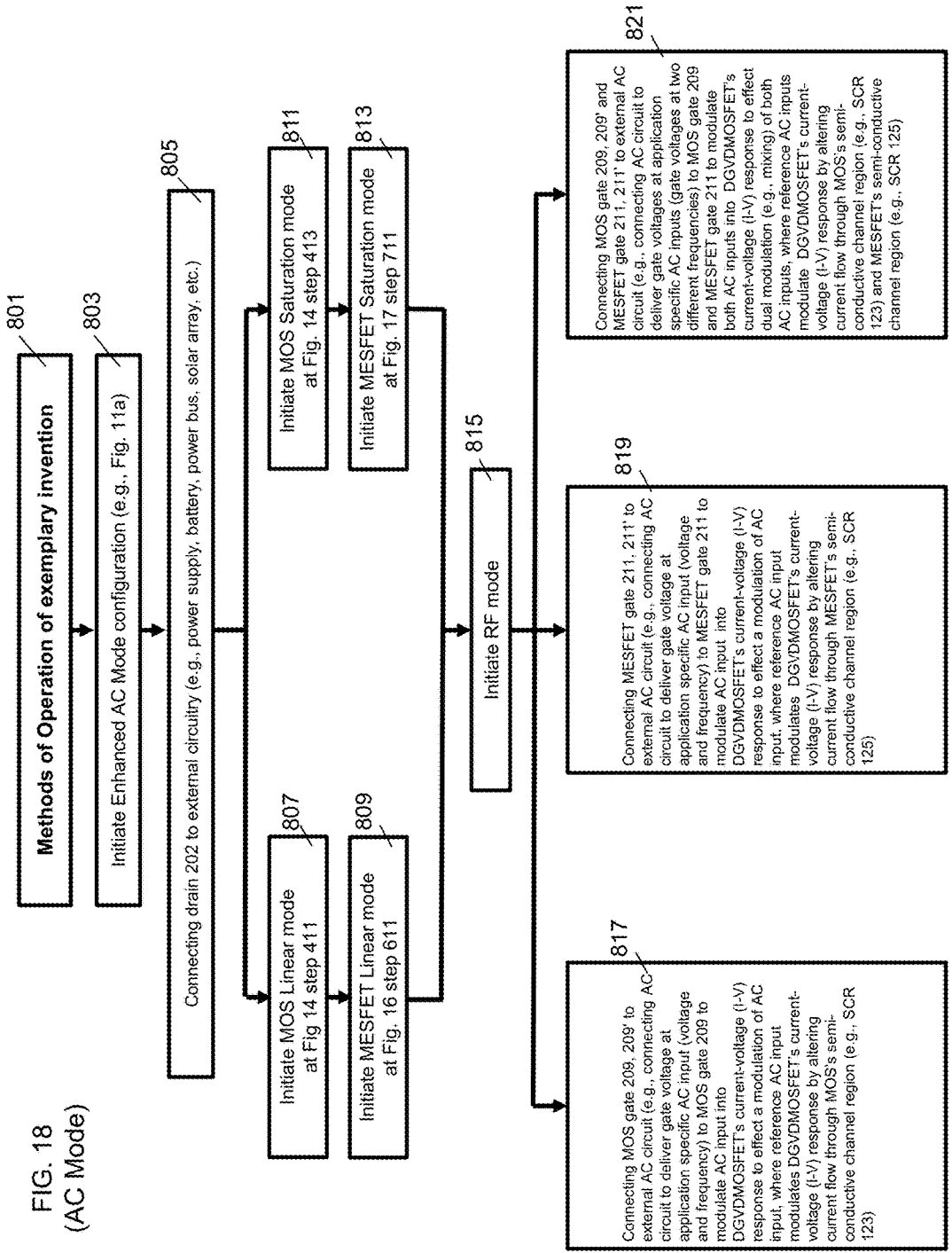
FIG. 18 shows another exemplary method of operation of an exemplary embodiment of the invention comprising another mode of operation.

FIG. 18 shows another exemplary method of operation 801 in accordance with another embodiment of the invention. Again, a process begins by initiating enhanced AC mode step 803 by connecting the drain 202 to an external circuit (e.g., power supply) step 805. The process continues by initiating either linear mode (MOS linear mode step 807 and MESFET linear mode step 809) or saturation mode (MOS saturation mode step 811 and MESFET saturation mode step 813). Another process can be employed by initiating RF mode step 815. RF mode of MOS gate step 817 begins by connecting the MOS gate 209 to an external AC circuit to deliver an AC voltage to MOS gate 209 to modulate DGVDMOSFET's I-V response to effect a modulation of AC input into DGVDMOSFET's response. RF mode of MESFET gate step 819 begins by connecting the MESFET gate 211 to an external AC circuit to deliver an AC voltage to MESFET gate 211 to modulate DGVDMOSFET's I-V response to effect a modulation of AC input into DGVDMOSFET's response. RF mode of both MOS gate and MESFET gate step 821 begins by connecting MOS gate 209 and MESFET gate 211 to external AC circuits to deliver AC voltages (in phase or out of phase) to said gates to modulate DGVDMOSFET response to said AC inputs.

Figure 19:
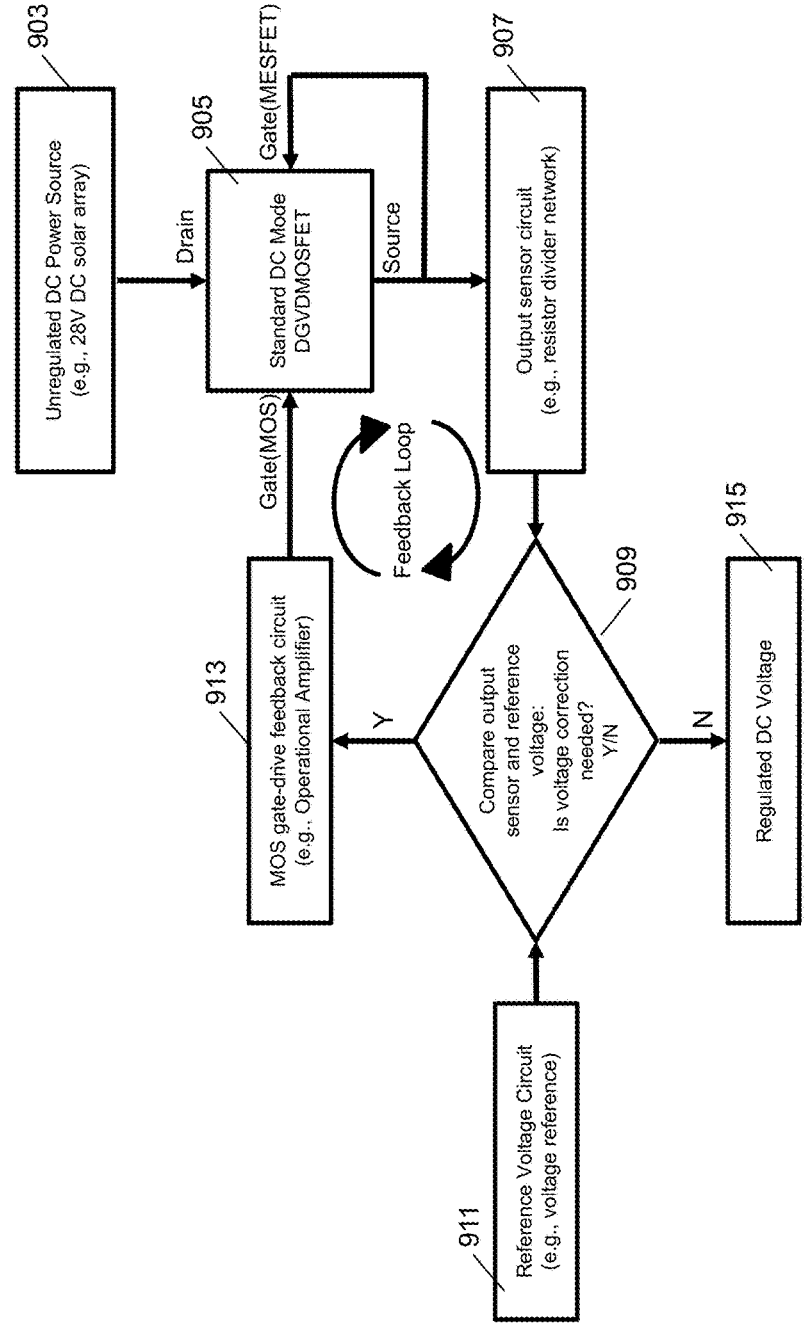
FIG. 19 shows an exemplary system application (linear voltage regulator) of an exemplary DGVDMOSFET in accordance with one embodiment of the invention.

FIG. 19 shows a block diagram of an exemplary application (a linear voltage regulator 901) where an exemplary DGVDMOSFET 905 is connected to an unregulated DC power source 903 (e.g., 28 volt solar array). The exemplary MESFET gate 211 is connected to source 201. The source 201 is connected to an output sensing circuit 907 (e.g., a resistor divider network). The sensing network 907 provides an input to an external feedback amplifier 909 with the other input being a reference voltage 911. If regulated DC output voltage 915 is lower or higher than expected output voltage, said feedback amplifier 909 adjusts the MOS gate voltage until expected output voltage is achieved.

Figure 20:
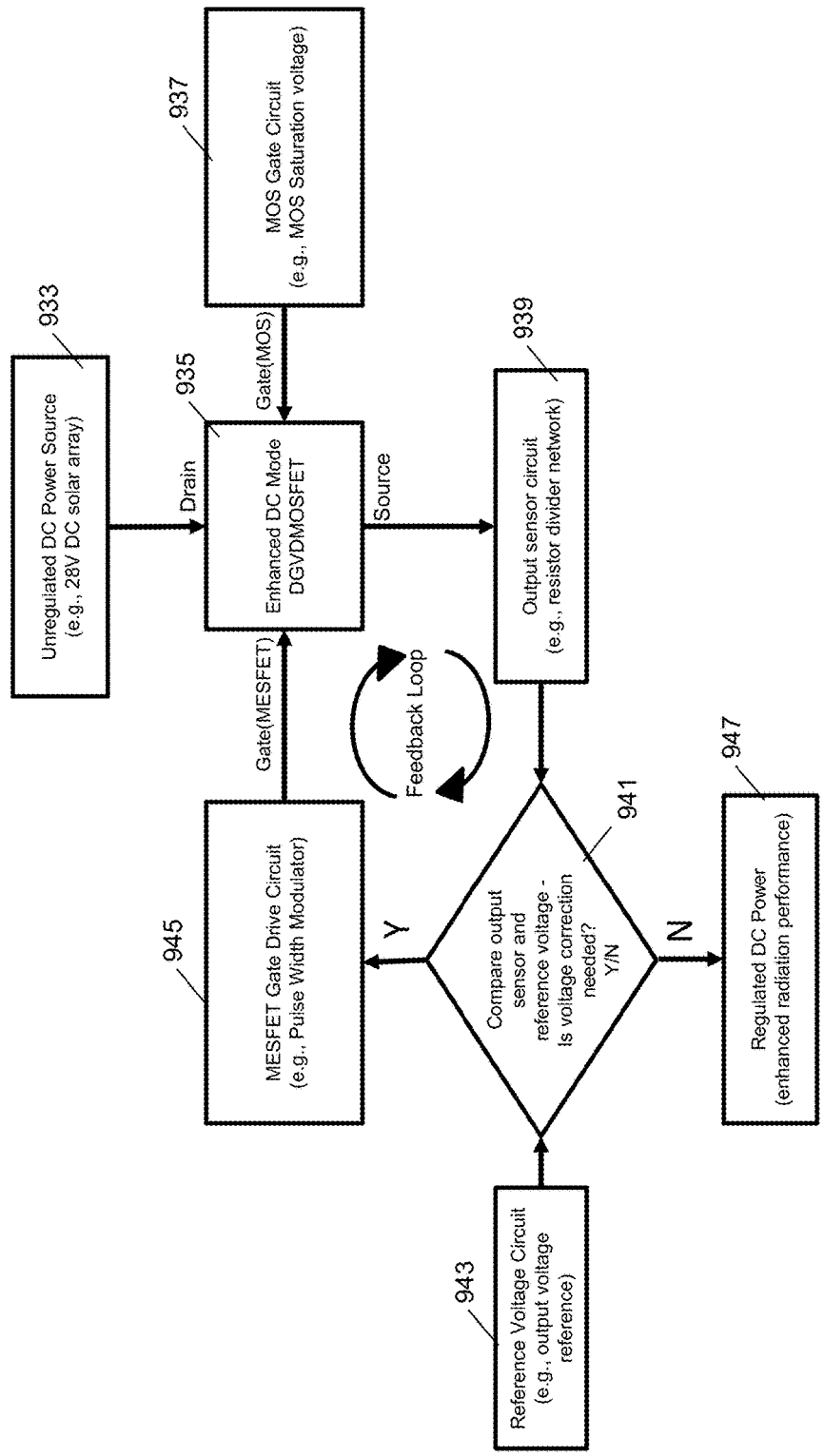
FIG. 20 shows another exemplary system application (switching voltage regulator) of an exemplary DGVDMOSFET in accordance with one embodiment of the invention.

FIG. 20 shows a block diagram of an exemplary application (a switching voltage regulator 931) where an exemplary DGVDMOSFET 935 is connected to an unregulated DC power source 933 (e.g., 28 volt solar array). The exemplary MOS gate 209 is connected to a MOS gate circuit 937 where MOS gate 209 is configured to operate in saturation mode. The source 201 is connected to an output sensing circuit 939 (e.g., a resistor divider network). The sensing network 939 provides an input to an external feedback amplifier 941 with the other input being a reference voltage 943. If regulated DC output voltage 947 is lower or higher than expected output voltage, said feedback amplifier 941 adjusts the MESFET gate drive circuit 945 (e.g., pulse width modulator) to adjust the duty cycle in switch mode until desired output voltage is achieved.

Figure 21:
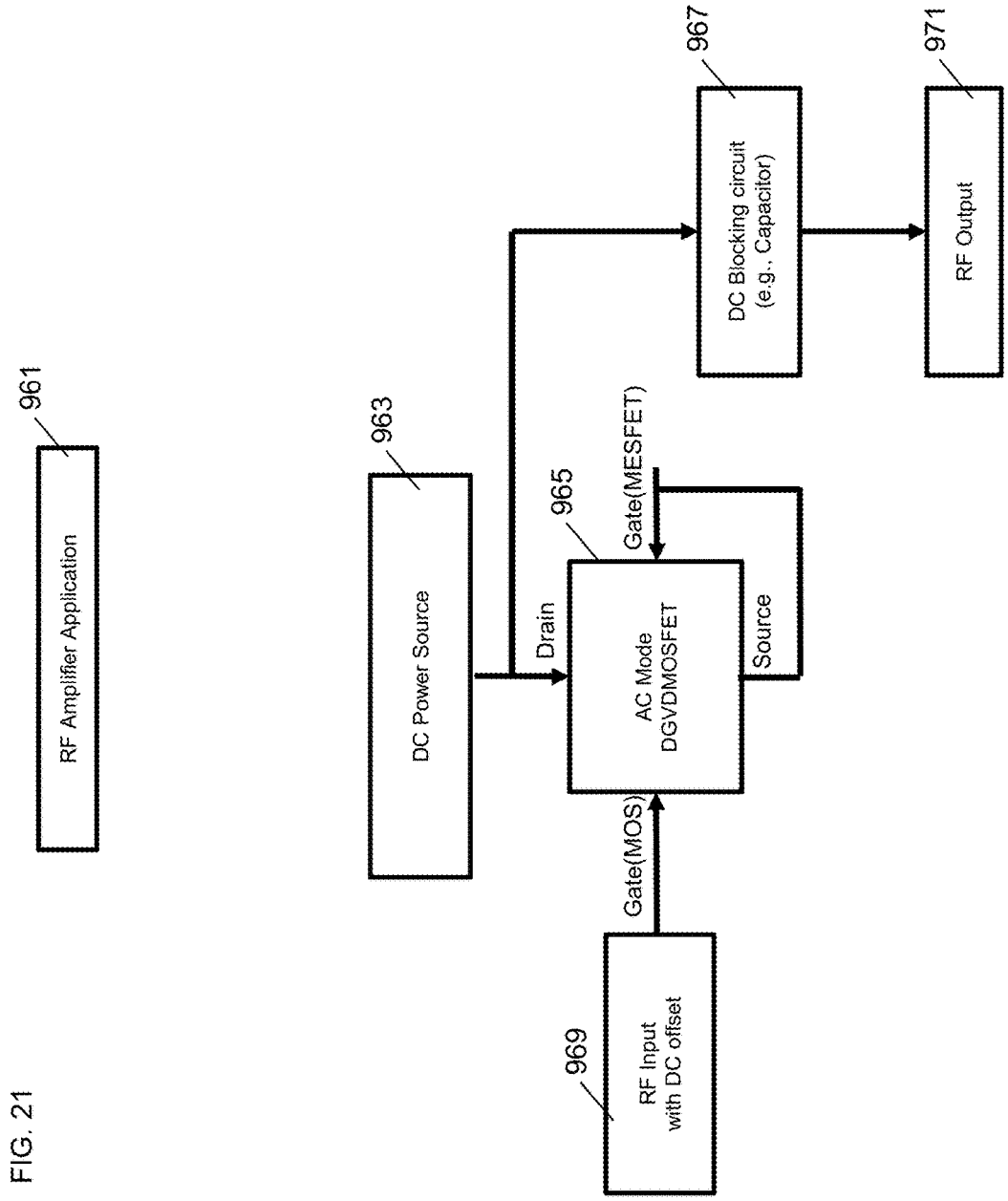
FIG. 21 shows another exemplary system application (RF amplifier) of an exemplary DGVDMOSFET in accordance with one embodiment of the invention.

FIG. 21 shows a block diagram of an exemplary application (RF amplifier 961) where an exemplary DGVDMOSFET 965 is connected to DC power source 963 (e.g., regulated voltage). The exemplary MESFET gate 211 is connected to source 201. The exemplary MOS gate 209 is connected to RF input with a DC offset circuit 969 where MOS gate 209 is configured to operate in linear AC mode. The drain 202 is connected to a DC blocking circuit 967 (e.g., capacitor), where DC blocking circuit 967 removes DC voltage from RF output 971.

Figure 22:
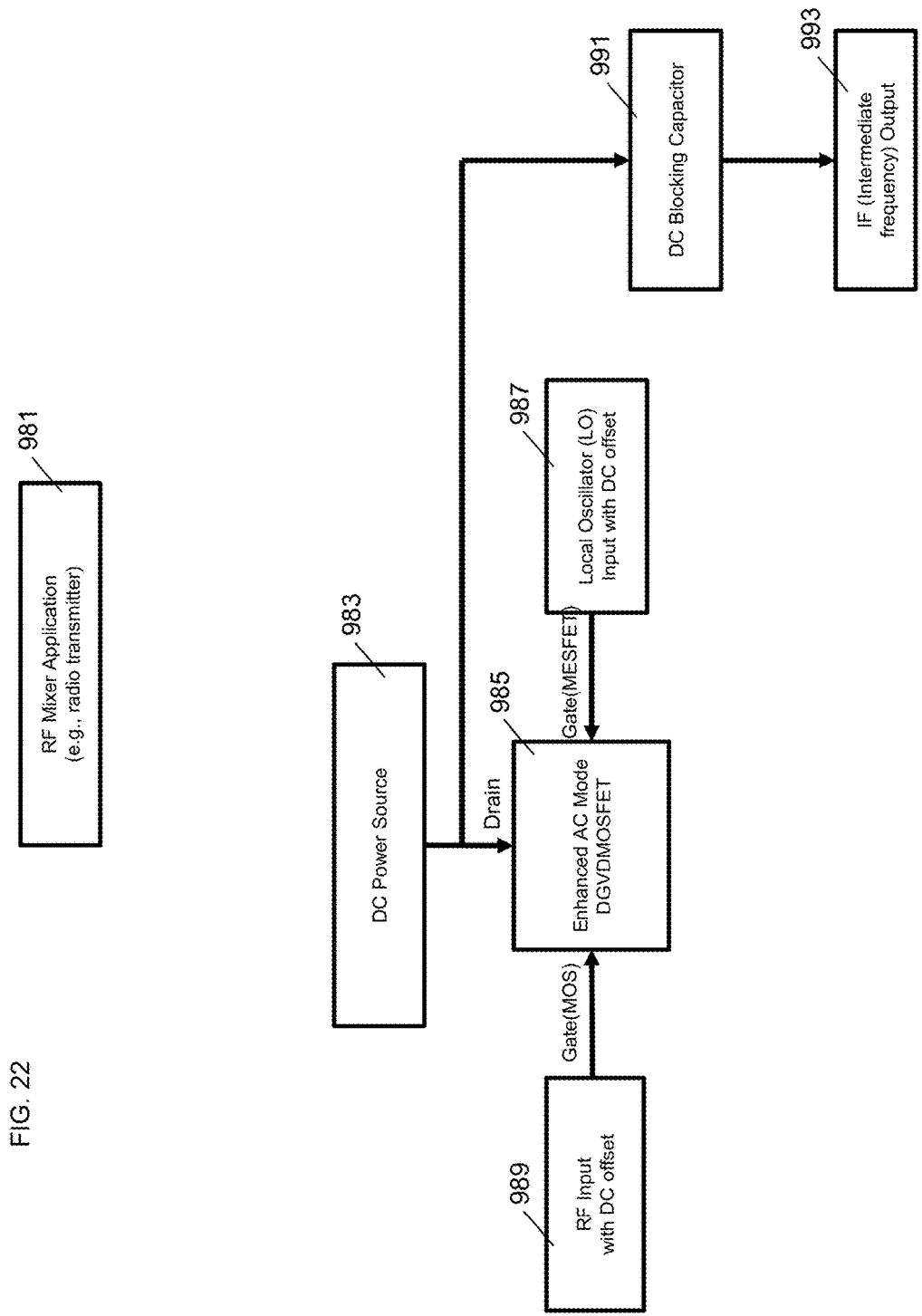
FIG. 22 shows another exemplary system application (RF Mixer) of an exemplary DGVDMOSFET in accordance with one embodiment of the invention.

FIG. 22 shows a block diagram of an exemplary application (RF mixer 981) where an exemplary DGVDMOSFET 985 is connected to DC power source 983 (e.g., regulated voltage). The exemplary MESFET gate 211 is connected to local oscillator (LO) with DC offset circuit 987, where the MESFET gate 211 is configured to operate in linear AC mode. The exemplary MOS gate 209 is connected to RF input with DC offset circuit 989 where the MOS gate 209 is configured to operate in linear AC mode. The drain 202 is also connected to DC blocking circuit 991 (e.g., capacitor), where DC blocking circuit 991 removes DC voltage from RF mixer output 993.

Although the invention has been described in detail with reference to certain preferred embodiments, variations and modifications exist within the spirit and scope of the invention as described and defined in the following claims.

The invention claimed is:

1. An electrical system comprising:
   a substrate formed having a first, second, and third section, wherein said first and third section are located on opposing sides of said second section;
   a first and second metal oxide semi-conductor field effect transistor (MOSFET) sections each respectively disposed in said first and third substrate sections, each MOSFET section comprising a body region formed into said substrate section, a source region formed inside said body region, a drain region formed by said substrate, a gate insulator region formed between and overlapping a portion of said source region and substrate covering a portion of said body region, a control gate formed and covering said gate insulator region and a MOSFET semi-conductive channel region (SCR) having first, second, and third SCR sides in close proximity to said gate insulator, where said first and second SCR sides are opposing sides and said third SCR side is orthogonal to said first and second SCR sides, where said first and second SCR sides form inside said body region between said source region adjacent to said first SCR side and said drain region adjacent to said second SCR side, where said control gate is adjacent to said third SCR side; and
   a metal-semiconductor field effect transistor (MESFET) section disposed onto said second substrate section in between said first and second substrate sections but not in contact with said first and second MOSFETs, said MESFET section comprising a MESFET control gate and a MESFET SCR where said MESFET SCR is in close proximity to second side of said MOSFET SCR, where said MESFET control gate comprising a metal or silicide, where said MESFET control gate is not in contact with said MOSFET body region or MOSFET control gate, where said MESFET control gate is positioned at a distance from said MOSFET body region, where said placement determines a distance that an electromagnetic field generated by said MESFET control gate must travel to traverse said MESFET SCR.

2. An electrical system as in claim 1, further comprising a control system for determining when said MESFET and said first or second MOSFET sections are to be operated comprising an automated system including sensors as well as a control section, wherein said automated system can include radiation sensors.

3. An electrical system as in claim 2, wherein said control systems can comprise a high-voltage radiofrequency transmitter or receiver systems.

4. The electrical system as in claim 1, further comprising a plurality of alternating current (AC) voltage sources each one coupled to said first and second MOSFET sections and said MESFET.

5. An electrical system as in claim 2, further comprising a control system operable to modulate said plurality of alternating-current (AC) voltage sources to generate a radiofrequency response output from said MOSFET sections and MESFET.

6. An electrical system as in claim 1, further comprising a plurality of direct-current (DC) voltage sources that are each coupled to a combined input gate of said first and second MOSFET sections that are coupled together as well as said MESFET section.

7. An electrical system as in claim 1, further comprising a direct-current (DC) voltage source that is coupled to a combined input gate of said first and second MOSFET sections wherein an input gate of said MESFET is coupled to a source for said first and second MOSFET sections coupled to a common drain for said first and second MOSFET sections.

8. An electrical system comprising:
a metal-semiconductor field effect transistor (MESFET);
a first and second metal oxide semiconductor (MOS) field effect transistor (MOSFET) sections formed to respectively create a first and second semi-conductive channel region on opposing sides of said MESFET, wherein said first and second MOSFET sections are disposed on opposite sides of said MESFET to respectively create a third and fourth semi-conductive channel regions that passes through a portion of said first and second semi-conductive channel regions such that operation of the MESFET modulates or controls current passing through otherwise controlled by an electrical path of the MOSFET sections associated with said first and second semi-conductive channel regions.

9. An electrical system as in claim 8, further comprising a control system for determining when said MESFET and said MOSFET is to be operated comprising an automated system including sensors as well as a control section, wherein said automated system can include radiation sensors as well as other control systems.

10. An electrical system as in claim 9, wherein said control systems can comprise a high-voltage radio-frequency transmitter or receiver systems.

11. The electrical system as in claim 8, further comprising a plurality of alternating-current (AC) voltage sources each one coupled to said first and second MOSFET sections and said MESFET.

12. An electrical system as in claim 11, further comprising a control system operable to modulate said plurality of alternating-current (AC) voltage sources to generate a radiofrequency response output from said MOSFET sections and MESFET.

13. An electrical system as in claim 8, further comprising a plurality of direct-current (DC) voltage sources that are each coupled to a combined input gate of said first and second MOSFET sections that are coupled together as well as said MESFET section.

14. An electrical system as in claim 8, further comprising a direct-current (DC) voltage source that is coupled to a combined input gate of said first and second MOSFET sections wherein an input gate of said MESFET is coupled to a source for said first and second MOSFET sections coupled to a common drain for said first and second MOSFET sections.

15. A method associated with an electrical system comprising:
providing an electrical system comprising a metal-semiconductor field-effect transistor (MESFET) and a first and second metal-oxide semiconductor (MOS) field-effect transistor (MOSFET) sections formed to respectively create a first and second semi-conductive channel region on opposing sides of said MESFET, wherein said first and second MOSFET sections are disposed on opposite sides of said MESFET to respectively create a third and fourth semi-conductive channel regions that passes through a portion of said first and second semi-conductive channel regions such that operation of the MESFET modulates or controls current passing through otherwise controlled by an electrical path of the MOSFET sections associated with said first and second semi-conductive channel regions.

16. A method as in claim 15 further comprising operating said MOS in response to a control input to adjust, modulate, or cut-off said current passing through first and second semi-conductive channel regions.

17. A method as in claim 16, wherein said operating comprises a MOS cut-off mode to halt passage of said electrical signals through said first or second MOSFET section.

18. A method as in claim 16, wherein said operating comprises a MOS linear mode to alter resistive characteristics of at least a portion of said first or second MOSFET sections.

19. A method as in claim 16, wherein said operating comprises a MOS saturation mode to limit an amount of current that can pass through at least a portion of said first or second MOSFET sections.

20. A method as in claim 15, further comprising providing a control system for determining when said MESFET and said first or second MOSFET sections are to be operated comprising an automated system including sensors as well as a control section, wherein said automated system can include radiation sensors.

21. A method as in claim 20, wherein said control systems can comprise a high-voltage radio-frequency transmitter or receiver systems.

22. A method as in claim 15, further comprising providing a plurality of alternating-current (AC) voltage sources each one coupled to said first and second MOSFET sections and said MESFET.

23. A method as in claim 15, further comprising providing a control system operable to modulate said plurality of alternating-current (AC) voltage sources to generate a radiofrequency response output from said MOSFET sections and MESFET.

24. A method as in claim 15, further comprising providing a plurality of direct-current (DC) voltage sources that are each coupled to a combined input gate of said first and second MOSFET sections that are coupled together as well as said MESFET section.

25. An electrical system as in claim 15, further comprising a direct-current (DC) voltage source that is coupled to a combined input gate of said first and second MOSFET sections wherein an input gate of said MESFET is coupled to a source for said first and second MOSFET sections coupled to a common drain for said first and second MOSFET sections.

26. A method as in claim 16, further comprising
detecting a source of radiation or electromagnetic interference operable to affect operation of said first or second MOSFET sections; and
operating said MESFET in response to said detecting said source of radiation or electromagnetic radiation to control passage of electrical signals through said first or second MOSFET sections to alter said first or second MOSFET's response to said source.

27. A method associated with an electrical control system comprising:
providing a substrate formed having a first, second, and third section, wherein said first and third section are located on opposing sides of said second section;
providing a first and second metal oxide semi-conductor field effect transistor (MOSFET) sections each respectively disposed in said first and third substrate sections, each MOSFET section comprising a body region formed into said substrate section, a source region formed inside said body region, a drain region formed by said substrate, a gate insulator region formed between and overlapping a portion of said source region and substrate covering a portion of said body region, a control gate formed and covering said gate insulator region and a MOSFET semi-conductive channel region (SCR) having first, second, and third SCR sides in close proximity to said gate insulator, where said first and second SCR sides are opposing sides and said third SCR side is orthogonal to said first and second SCR sides, where said first and second SCR sides form inside said body region between said source region adjacent to said first SCR side and said drain region adjacent to said second SCR side, where said control gate is adjacent to said third SCR side; and
providing a metal-semiconductor field effect transistor (MESFET) section disposed onto said second substrate section in between said first and second substrate sections but not in contact with said first and second MOSFETs, said MESFET section comprising a MESFET control gate and a MESFET SCR where said MESFET SCR is in close proximity to second side of said MOSFET SCR, where said MESFET control gate comprising a metal or silicide, where said MESFET control gate is not in contact with said MOSFET body region or MOSFET control gate, where said MESFET control gate is positioned at a distance from said MOSFET body region, where said placement determines a distance that an electromagnetic field generated by said MESFET control gate must travel to traverse said MESFET SCR.

28. A method as in claim 27 further comprising operating said MESFET to control passage of electrical signals through said first or second MOSFET sections.

29. A method as in claim 27, further comprising
detecting a source of radiation or electromagnetic interference operable to affect operation of said first or second MOSFET sections; and
operating said MESFET in response to said detecting said source of radiation or electromagnetic radiation to control passage of electrical signals through said first or second MOSFET sections to alter said first or second MOSFET's response to said source.

30. A method as in claim 28, wherein said operating comprises a MESFET cut-off mode to halt passage of said electrical signals through said first or second MOSFET section.

31. A method as in claim 28, wherein said operating comprises a MESFET linear mode to alter resistive characteristics of at least a portion of said first or second MOSFET sections.

32. A method as in claim 28, wherein said operating comprises a MESFET saturation mode to limit an amount of current that can pass through at least a portion of said first or second MOSFET sections.

33. An electrical system comprising:
a substrate formed having a first, second, and third section, wherein said first and third section are located on opposing sides of said second section;
a first and second metal oxide semi-conductor field effect transistor (MOSFET) sections each respectively disposed in said first and third substrate sections, each MOSFET section comprising a body region formed into said substrate section, a source region formed inside said body region, a drain region formed by said substrate, a gate insulator region formed between and overlapping a portion of said source region and substrate covering a portion of said body region, a control gate formed and covering said gate insulator region and a MOSFET semi-conductive channel region (SCR) having first, second, and third SCR sides in close proximity to said gate insulator, where said first and second SCR sides are opposing sides and said third SCR side is orthogonal to said first and second SCR sides, where said first and second SCR sides form inside said body region between said source region adjacent to said first SCR side and said drain region adjacent to said second SCR side, where said control gate is adjacent to said third SCR side; and
a metal-semiconductor field effect transistor (MESFET) section disposed onto said second substrate section in between said first and second substrate sections but not in contact with said first and second MOSFETs, said MESFET section comprising a MESFET control gate and a MESFET SCR where said MESFET SCR is in close proximity to second side of said MOSFET SCR, where said MESFET control gate comprising a metal or silicide, where said MESFET control gate is not in contact with said MOSFET body region or MOSFET control gate, where said MESFET control gate is positioned at a distance from said MOSFET body region, where said placement determines a distance that an electromagnetic field generated by said MESFET control gate must travel to traverse said MESFET SCR;
a control system for determining when said MESFET and said first or second MOSFET sections are to be operated comprising an automated system including sensors for detecting an electromagnetic interference field as well as a control section; and
a plurality of electrical sources coupled to said first and second MOSFET sections and said MESFET.

34. The electrical system as in claim 33, wherein said automated system can include radiation sensors.

35. The electrical system as in claim 33, further comprising a control comprising a high-voltage radio-frequency transmitter or receiver systems operated by an output that is controlled or modulated by a combination of said first MOSFET, second MOSFET, and said MESFET.

36. The electrical system as in claim 33, wherein said plurality of electrical sources comprises a plurality of alternating-current (AC) voltage sources each one coupled to said first and second MOSFET sections and said MESFET.

37. The electrical system as in claim 36, further comprising a control system operable to modulate said plurality of electrical sources to generate a radio-frequency response output from said MOSFET sections and MESFET.

38. The electrical system as in claim 33, wherein said plurality of electrical sources comprises a plurality of direct-current (DC) voltage sources that are each coupled to a combined input gate of said first and second MOSFET sections that are coupled together as well as said MESFET section.

39. An electrical system as in claim 33, wherein said plurality of electrical sources comprises a direct-current (DC) voltage source that is coupled to a combined input gate of said first and second MOSFET sections wherein an input gate of said MESFET is coupled to a source of said first and second MOSFET sections coupled to a common drain for said first and second MOSFET sections.

40. An electrical system comprising:
a metal-semiconductor field effect transistor (MESFET);
a first and second metal-oxide semiconductor (MOS) field-effect transistor (MOSFET) sections formed to respectively create a first and second semi-conductive channel region on opposing sides of said MESFET, wherein said first and second MOSFET sections are disposed on opposite sides of said MESFET to respectively create a third and fourth semi-conductive channel regions that passes through a portion of said first and second semi-conductive channel regions such that operation of the MESFET modulates or controls current passing through otherwise controlled by an electrical path of the MOSFET sections associated with said first and second semi-conductive channel regions;
a control system for determining when said MESFET and said first or second MOSFET sections are to be operated comprising an automated system including sensors for detecting an electromagnetic interference field as well as a control section; and
a plurality of electrical sources coupled to said first and second MOSFET sections and said MESFET.

41. The electrical system as in claim 40, wherein said automated system can include radiation sensors.

42. The electrical system as in claim 40, further comprising a control comprising a high-voltage radio-frequency transmitter or receiver systems operated by an output that is controlled or modulated by a combination of said first MOSFET, second MOSFET, and said MESFET.

43. The electrical system as in claim 40, wherein said plurality of electrical sources comprises a plurality of alternating-current (AC) voltage sources each one coupled to said first and second MOSFET sections and said MESFET.

44. The electrical system as in claim 43, further comprising a control system operable to modulate said plurality of electrical sources to generate a radio-frequency response output from said MOSFET sections and MESFET.

45. The electrical system as in claim 40, wherein said plurality of electrical sources comprises a plurality of direct-current (DC) voltage sources that are each coupled to a combined input gate of said first and second MOSFET sections that are coupled together as well as said MESFET section.

46. An electrical system as in claim 40, wherein said plurality of electrical sources comprises a direct-current (DC) voltage source that is coupled to a combined input gate of said first and second MOSFET sections wherein an input gate of said MESFET is coupled to a source for said first and second MOSFET sections coupled to a common drain for said first and second MOSFET sections.

47. A method associated with an electrical system comprising:
providing an electrical system comprising a metal-semiconductor field effect transistor (MESFET) and a first and second metal oxide semiconductor (MOS) field effect transistor (MOSFET) sections formed to respectively create a first and second semi-conductive channel region on opposing sides of said MESFET, wherein said first and second MOSFET sections are disposed on opposite sides of said MESFET to respectively create a third and fourth semi-conductive channel regions that passes through a portion of said first and second semi-conductive channel regions such that operation of the MESFET modulates or controls current passing through otherwise controlled by an electrical path of the MOSFET sections associated with said first and second semi-conductive channel regions;
providing a control system for determining when said MESFET and said first or second MOSFET sections are to be operated comprising an automated system including sensors as well as a control section, wherein said determining step can comprise detecting a source of radiation or electromagnetic interference operable to affect operation of said first or second MOSFET sections; and
providing a plurality of electrical sources coupled to said first and second MOSFET sections and said MESFET.

48. A method as in claim 47 further comprising operating said electrical system in one of a plurality of modes comprising a first, second, or third mode in response to a control input to adjust, modulate, or cut-off said current passing through first and second semi-conductive channel regions.

49. A method as in claim 48, wherein said first mode comprises operating comprises operating said MOS in a MOS cut-off mode to halt passage of said electrical signals through said first or second MOSFET section; wherein said second mode comprises operating said MOS in a MOS linear mode to alter resistive characteristics of at least a portion of said first or second MOSFET sections; and wherein said third mode comprises operating said MOS in a MOS saturation mode to limit an amount of current that can pass through at least a portion of said first or second MOSFET sections.

50. A method as in claim 47, wherein said control systems can comprise a high-voltage radio-frequency transmitter or receiver systems.

51. A method as in claim 47, wherein said providing a plurality electrical sources comprises providing a plurality of alternating-current (AC) voltage sources each one coupled to said first and second MOSFET sections and said MESFET.

52. A method as in claim 47, further comprises providing a control system operable to modulate said plurality of alternating-current (AC) voltage sources to generate a radio-frequency response output from said MOSFET sections and MESFET.

53. A method as in claim 47, wherein said providing a plurality electrical sources comprises further comprising providing a plurality of direct-current (DC) voltage sources that are each coupled to a combined input gate of said first and second MOSFET sections that are coupled together as well as said MESFET section.

54. An electrical system as in claim 47, wherein said providing a plurality electrical sources comprises further comprising providing a direct-current (DC) voltage source that is coupled to a combined input gate of said first and second MOSFET sections wherein an input gate of said MESFET is coupled to a source for said first and second MOSFET sections coupled to a common drain for said first and second MOSFET sections.

55. A method as in claim 47, further comprising
operating said MESFET in response to said detecting said source of radiation or electromagnetic radiation to control passage of electrical signals through said first or second MOSFET sections to alter said first or second MOSFET's response to said source.

56. A method associated with an electrical control system comprising:
providing a substrate formed having a first, second, and third section, wherein said first and third section are located on opposing sides of said second section;
providing a first and second metal oxide semi-conductor field effect transistor (MOSFET) sections each respectively disposed in said first and third substrate sections, each MOSFET section comprising a body region formed into said substrate section, a source region formed inside said body region, a drain region formed by said substrate, a gate insulator region formed between and overlapping a portion of said source region and substrate covering a portion of said body region, a control gate formed and covering said gate insulator region and a MOSFET semi-conductive channel region (SCR) having first, second, and third SCR sides in close proximity to said gate insulator, where said first and second SCR sides are opposing sides and said third SCR side is orthogonal to said first and second SCR sides, where said first and second SCR sides form inside said body region between said source region adjacent to said first SCR side and said drain region adjacent to said second SCR side, where said control gate is adjacent to said third SCR side; and
providing a metal-semiconductor field effect transistor (MESFET) section disposed onto said second substrate section in between said first and second substrate sections but not in contact with said first and second MOSFETs, said MESFET section comprising a MESFET control gate and a MESFET SCR where said MESFET SCR is in close proximity to second side of said MOSFET SCR, where said MESFET control gate comprising a metal or silicide, where said MESFET control gate is not in contact with said MOSFET body region or MOSFET control gate, where said MESFET control gate is positioned at a distance from said MOSFET body region, where said placement determines a distance that an electromagnetic field generated by said MESFET control gate must travel to traverse said MESFET SCR;
providing a control system for determining when said MESFET and said first or second MOSFET sections are to be operated comprising an automated system including sensors as well as a control section, wherein said determining step can comprise detecting a source of radiation or electromagnetic interference operable to affect operation of said first or second MOSFET sections; and
providing a plurality of electrical sources coupled to said first and second MOSFET sections and said MESFET.

57. A method as in claim 56 further comprising operating said electrical system in one of a plurality of modes comprising a first, second, or third mode in response to a control input to adjust, modulate, or cut-off said current passing through first and second semi-conductive channel regions.

58. A method as in claim 57, wherein said first mode comprises operating comprises operating said MOS in a MOS cut-off mode to halt passage of said electrical signals through said first or second MOSFET section; wherein said second mode comprises operating said MOS in a MOS linear mode to alter resistive characteristics of at least a portion of said first or second MOSFET sections; and wherein said third mode comprises operating said MOS in a MOS saturation mode to limit an amount of current that can pass through at least a portion of said first or second MOSFET sections.

59. A method as in claim 56, wherein said control systems can comprise a high-voltage radio-frequency transmitter or receiver systems.

60. A method as in claim 56, wherein said providing a plurality electrical sources comprises providing a plurality of alternating-current (AC) voltage sources each one coupled to said first and second MOSFET sections and said MESFET.

61. A method as in claim 56, further comprises providing a control system operable to modulate said plurality of alternating-current (AC) voltage sources to generate a radio-frequency response output from said MOSFET sections and MESFET.

62. A method as in claim 56, wherein said providing a plurality electrical sources comprises further comprising providing a plurality of direct-current (DC) voltage sources that are each coupled to a combined input gate of said first and second MOSFET sections that are coupled together as well as said MESFET section.

63. An electrical system as in claim 56, wherein said providing a plurality electrical sources comprises further comprising providing a direct-current (DC) voltage source that is coupled to a combined input gate of said first and second MOSFET sections wherein an input gate of said MESFET is coupled to a source for said first and second MOSFET sections coupled to a common drain for said first and second MOSFET sections.

64. A method as in claim 56, further comprising operating said MESFET in response to said detecting said source of radiation or electromagnetic radiation to control passage of electrical signals through said first or second MOSFET sections to alter said first or second MOSFET's response to said source.

* * * * *